(12) United States Patent
Kim et al.

(10) Patent No.: US 12,120,911 B2
(45) Date of Patent: *Oct. 15, 2024

(54) DISPLAY APPARATUS AND ELECTRIC APPARATUS INCLUDING THE SAME

(71) Applicant: SAMSUNG DISPLAY CO., LTD., Yongin-si (KR)

(72) Inventors: Ki Seo Kim, Yongin-si (KR); Jae-Kyoung Kim, Hwaseong-si (KR); Won Sang Park, Yongin-si (KR); Bong Hyun You, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/298,565

(22) Filed: Apr. 11, 2023

(65) Prior Publication Data
US 2023/0255054 A1 Aug. 10, 2023

Related U.S. Application Data

(63) Continuation of application No. 16/983,184, filed on Aug. 3, 2020, now Pat. No. 11,626,455.

(30) Foreign Application Priority Data

Oct. 4, 2019 (KR) .......................... 10-2019-0123288

(51) Int. Cl.
*H10K 59/00* (2023.01)
*H01Q 1/24* (2006.01)
(Continued)

(52) U.S. Cl.
CPC ............. *H10K 59/00* (2023.02); *H01Q 1/243* (2013.01); *H01Q 9/0407* (2013.01);
(Continued)

(58) Field of Classification Search
CPC ...... H10K 59/00; H01Q 1/243; H01Q 9/0407; H04M 1/0268
(Continued)

(56) References Cited

U.S. PATENT DOCUMENTS 9,582,043 B2 2/2017 Hirakata
9,952,622 B2 4/2018 Kim et al.
(Continued)

FOREIGN PATENT DOCUMENTS

CN 107077806 A 8/2017
CN 108594934 9/2018
(Continued)

OTHER PUBLICATIONS

European Search Report dated Jun. 30, 2021 in corresponding European Patent Application No. 20196338.6 (17 pages).
(Continued)

*Primary Examiner* — Prabodh M Dharia
(74) *Attorney, Agent, or Firm* — F. CHAU & ASSOCIATES, LLC

(57) ABSTRACT

A display apparatus includes a flexible display panel including a display area with a first folding area, the display area including an upper surface and a lower surface and displaying an image via the upper surface, a cover window disposed on the upper surface of the display area of the flexible display panel and an antenna layer including a first antenna disposed on an upper surface of the first folding area. The upper surface of the display area includes the upper surface of the first folding area. The first antenna is disposed between the upper surface of the first folding area and the cover window.

20 Claims, 15 Drawing Sheets

(51) Int. Cl.
*H01Q 9/04* (2006.01)
*H04M 1/02* (2006.01)
*H10K 59/12* (2023.01)
*H10K 77/10* (2023.01)

(52) U.S. Cl.
CPC .......... *H04M 1/0268* (2013.01); *H10K 59/12* (2023.02); *H10K 77/111* (2023.02)

(58) Field of Classification Search
USPC ........................................................ 361/814
See application file for complete search history.

(56) References Cited

U.S. PATENT DOCUMENTS

| | | | |
|---|---|---|---|
| 10,043,421 B2 | 8/2018 | Koo et al. | |
| 10,203,726 B2 | 2/2019 | Rho et al. | |
| 10,331,341 B2 | 6/2019 | Ryu et al. | |
| 10,613,586 B2 | 4/2020 | Yamazaki | |
| 11,075,449 B2 | 7/2021 | Zhou | |
| 11,079,803 B2 | 8/2021 | Ha et al. | |
| 11,106,099 B2 | 8/2021 | Yamazaki et al. | |
| 11,119,534 B2* | 9/2021 | Lee | G06F 1/1616 |
| 11,392,175 B2 | 7/2022 | Fournier et al. | |
| 2010/0328171 A1 | 12/2010 | Mak et al. | |
| 2014/0066130 A1 | 3/2014 | Yang et al. | |
| 2014/0240178 A1 | 8/2014 | Chun et al. | |
| 2015/0029652 A1 | 1/2015 | Min et al. | |
| 2015/0207102 A1 | 7/2015 | Jeong et al. | |
| 2016/0246558 A1 | 8/2016 | Prushinskiy et al. | |
| 2016/0266774 A1* | 9/2016 | Kim | G06T 3/40 |
| 2016/0274718 A1 | 9/2016 | Burr et al. | |
| 2017/0235398 A1 | 8/2017 | Choi et al. | |
| 2017/0250460 A1* | 8/2017 | Shin | H04M 1/0277 |
| 2017/0263891 A1 | 9/2017 | Oh et al. | |
| 2017/0285844 A1* | 10/2017 | Park | G06F 1/1647 |
| 2017/0318690 A1* | 11/2017 | Jung | B29C 65/4845 |
| 2019/0018454 A1* | 1/2019 | Jung | G06F 1/1652 |
| 2020/0174526 A1 | 6/2020 | Jeong et al. | |
| 2020/0185641 A1* | 6/2020 | Jeong | H10K 77/111 |
| 2021/0104582 A1 | 4/2021 | Kim et al. | |

FOREIGN PATENT DOCUMENTS

| | | |
|---|---|---|
| CN | 109167151 A | 1/2019 |
| CN | 109193115 A | 1/2019 |
| CN | 109193123 A | 1/2019 |
| CN | 109216868 A | 1/2019 |
| EP | 2403222 | 1/2012 |
| EP | 2772826 | 9/2014 |
| EP | 3226101 | 10/2017 |
| JP | 2005-321702 A2 | 11/2005 |
| JP | 2014-204377 A2 | 10/2014 |
| JP | 2015-064570 A2 | 4/2015 |
| JP | 2018-025756 A2 | 2/2018 |
| JP | 2019-516123 A2 | 6/2019 |
| KR | 10-2016-0090471 A | 8/2016 |
| KR | 10-2017-0040643 A | 4/2017 |
| KR | 10-2017-0100972 | 9/2017 |
| KR | 10-2017-0136258 A | 12/2017 |
| KR | 10-2019-0021837 | 3/2019 |
| KR | 10-1971441 | 4/2019 |
| KR | 10-1971490 | 4/2019 |
| KR | 10-2019-0089515 | 7/2019 |
| WO | WO2016151426 A1 | 9/2016 |

OTHER PUBLICATIONS

Partial European Search Report dated Feb. 26, 2021 in corresponding European Patent Application No. 20196338.6 (18 pages).
Office Action dated Jun. 18, 2024 in corresponding Korean Patent Application No. 10-2019-0123288 (in Korean), 8 pages.
Japanese Office Action dated Apr. 9, 2024 issued in related Japanese Appln. No. 2020-085620 (5 pages).
Office Action dated Jul. 31, 2024 for related Chinese Patent Application No. 202011021762.1, 16 pages (in Chinese).

* cited by examiner

DISPLAY APPARATUS AND ELECTRIC APPARATUS INCLUDING THE SAME

CROSS-REFERENCE TO RELATED APPLICATION

This application is a continuation of U.S. application Ser. No. 16/983,184 filed on Aug. 3, 2020, which claims priority under 35 USC § 119 to Korean Patent Application No. 10-2019-0123288 filed on Oct. 4, 2019 in the Korean Intellectual Property Office (KIPO), the entire disclosure of which is herein incorporated by reference.

BACKGROUND

1. Field

The present inventive concept relates to a display apparatus and an electronic apparatus including the display apparatus. More particularly, the present inventive concept relates to a display apparatus with an antenna embedded therein and an electronic apparatus including the display apparatus.

2. Description of the Related Art

Recently, as the technology improves, display products having smaller sizes, lighter weights, and superior performance have been produced. Conventional cathode ray tube (CRT) televisions were widely used for display apparatuses with many advantages in terms of performance and price. Recently, however, a display apparatus such as a plasma display apparatus, a liquid crystal display apparatus, and an organic light emitting diode display apparatus, which overcomes weak points of the CRT in terms of miniaturization or portability and has advantages such as miniaturization, light weight, and low power consumption, has been spotlighted.

An electronic apparatus including the display apparatus may include an antenna for performing a communication function. As an area occupied by the display apparatus increases in the electronic apparatus, signal loss and signal blocking phenomena may become severe due to a structural problem of the antenna provided in the electronic apparatus.

SUMMARY

Some example embodiments provide a display apparatus including an antenna and having improved antenna performance.

Some example embodiments provide an electronic apparatus including the display apparatus.

According to an example embodiment of the present inventive concept, a display apparatus includes a flexible display panel including a display area with a first folding area, the display area including an upper surface and a lower surface and displaying an image via the upper surface, a cover window disposed on the upper surface of the display area of the flexible display panel and an antenna layer including a first antenna disposed on an upper surface of the first folding area. The upper surface of the display area includes the upper surface of the first folding area. The first antenna is disposed between the upper surface of the first folding area and the cover window.

In example embodiments, the first folding area, when bent, is configured to have the upper surface of the first folding area with a curved surface. The first antenna is disposed on the curved surface of the upper surface.

In example embodiments, the display area of the flexible display panel further includes a main display area. The first folding area is connected to an edge of the main display area. The first folding area, when bent in a direction perpendicular to the main display area, is configured to have the upper surface of the first folding area with a curved surface.

In example embodiments, the display area of the flexible display panel further includes a second folding area, a third folding area, a fourth folding area, and a main display area. Each of the first folding area, the second folding area, the third folding area and the fourth folding area is connected to a corresponding edge of the main display area. The first antenna is disposed on the first folding area. The antenna layer further includes a second antenna disposed On the second folding area, a third antenna disposed on the third folding area, and a fourth antenna disposed on the fourth folding area.

In example embodiments, the display area of the flexible display panel further includes a first non-folding area and a second non-folding area. The first folding area is disposed between the first non-folding area and the second non-folding area. The first folding area, when folded, is configured to cause a display surface of the first non-folding area and a display surface of the second non-folding area to be directed outward. The upper surface of the display area includes the display surface of the first non-folding area and the display surface of the second non-folding area.

In example embodiments, the antenna layer further includes a second antenna disposed on the upper surface of the first non-folding area.

In example embodiments, the flexible display panel further includes a circuit area and a connection portion. The circuit area is connected to the first folding area via the connection portion. The connection portion, when folded, between the circuit area and the display area is configured to cause an upper surface of the circuit area to face toward the lower surface of the display area. The circuit area and the connection portion are a non-pixel area of the flexible display panel.

In example embodiments, the display area of the flexible display panel further includes a second folding area and a third non-folding area. The second folding area is disposed between the second non-folding area and the third non-folding area. The first folding area and the second folding area, when bent, are configured to cause the first non-folding area, the second non-folding area, and the third non-folding area to overlap each other.

In example embodiments, the display area of the flexible display panel further includes a first non-folding area, a second non-folding area, a second folding area, and a third non-folding area. The first folding area is disposed between the first non-folding area and the second non-folding area. The second folding area is disposed between the second non-folding area and the third non-folding area. The antenna layer further includes a second antenna disposed on an upper surface of the second folding area. The upper surface of the display area includes the upper surface of the second folding area.

In example embodiments, the flexible display panel further includes a first circuit area and a first connection portion. The first circuit area is connected to the first non-folding area via the first connection portion. The flexible display panel further includes a second circuit area and a second connection portion. The second circuit area is connected to the third non-folding area via the second connection portion. The first connection portion and the second connection portion, when bent, are configured to cause an upper surface of the first circuit area and an upper surface of the second circuit area to face toward a lower surface of the first non-folding area and a lower surface of the third non-folding area, respectively.

In example embodiments, the first folding area is configured to be rollable.

In example embodiments, the display area of the flexible display panel includes a rolling area and a non-rolling area connected to the rolling area. The antenna layer further includes a second antenna disposed on an upper surface of the non-rolling area. The flexible display panel includes a circuit area and a connection portion. The circuit area is connected to the non-rolling area via the connection portion. The connection portion, when bent, between the circuit area and the non-rolling area is configured to cause the circuit area to face toward the non-rolling area.

In example embodiments, the first antenna includes a radiation pattern having a lattice shape or a mesh shape.

In example embodiments, the flexible display panel includes a flexible substrate, a thin film transistor disposed on the flexible substrate, a light emitting structure electrically connected to the thin film transistor, and a thin film encapsulation layer disposed on the light emitting structure. The antenna layer is disposed on the thin film encapsulation layer.

In example embodiments, the display apparatus further includes a touch electrode layer disposed between the cover window and the flexible display panel and including a touch electrode.

In example embodiments, the first antenna is embedded in the flexible display panel.

In example embodiments, the first antenna includes a conductive layer disposed between insulating layers.

According an example embodiment of the present inventive concept, a display apparatus includes a flexible display panel including a display area and a circuit area adjacent to the display area, the circuit area being a non-pixel area of the flexible display panel, a cover window disposed on the flexible display panel, and an antenna disposed on an upper surface of the display area and between the flexible display panel and the cover window. The flexible display panel further includes a connection portion between the circuit area and the display area. The connection portion, when bent, is configured to cause the circuit area to face a lower surface, opposite to the upper surface, of the display area.

In example embodiments, the upper surface of the display area of the flexible display panel includes a curved surface. The antenna is disposed on the curved surface.

According to an example embodiment of the present inventive concept, an electronic apparatus includes a display apparatus including a display surface that displays an image and includes a curved surface, an antenna disposed on the curved surface, and a housing coupled to the display apparatus.

Therefore, a display apparatus according to example embodiments may include a display surface that displays an image and includes a curved surface. The display apparatus may include a curved surface or may be partially folded or rolled. An antenna element may be disposed on the curved surface of the display apparatus. For example, in an electronic apparatus including the display apparatus, an antenna element may be disposed even on a side surface of the electronic apparatus surrounded by the display area. Accordingly, antenna performance of the electronic apparatus may be improved.

BRIEF DESCRIPTION OF THE DRAWINGS

Illustrative, non-limiting example embodiments will be more clearly understood from the following detailed description in conjunction with the accompanying drawings.

DETAILED DESCRIPTION OF EXAMPLE EMBODIMENTS

Hereinafter, embodiments of the present inventive concept will be explained in detail with reference to the accompanying drawings.

Figure 1:
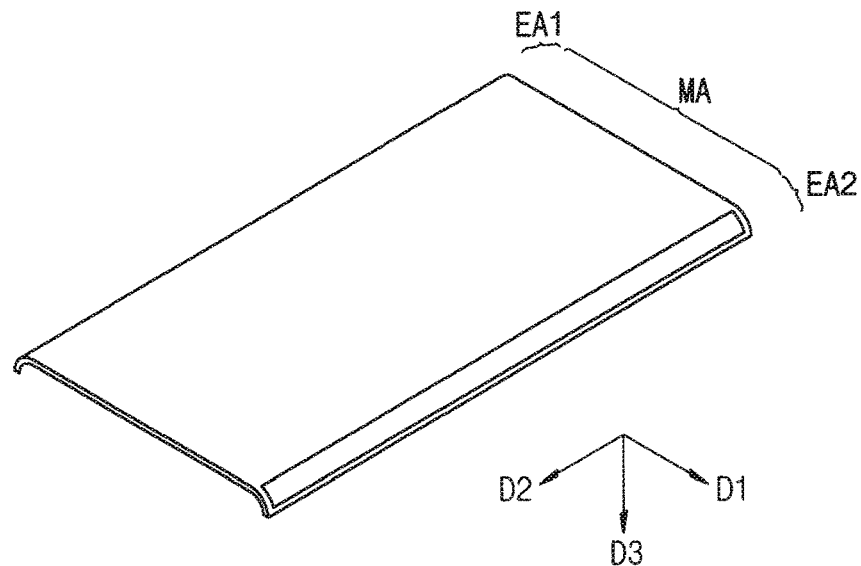
FIG. 1 is a perspective diagram illustrating a display apparatus according to example embodiments of the present inventive concept.
Figure 2:
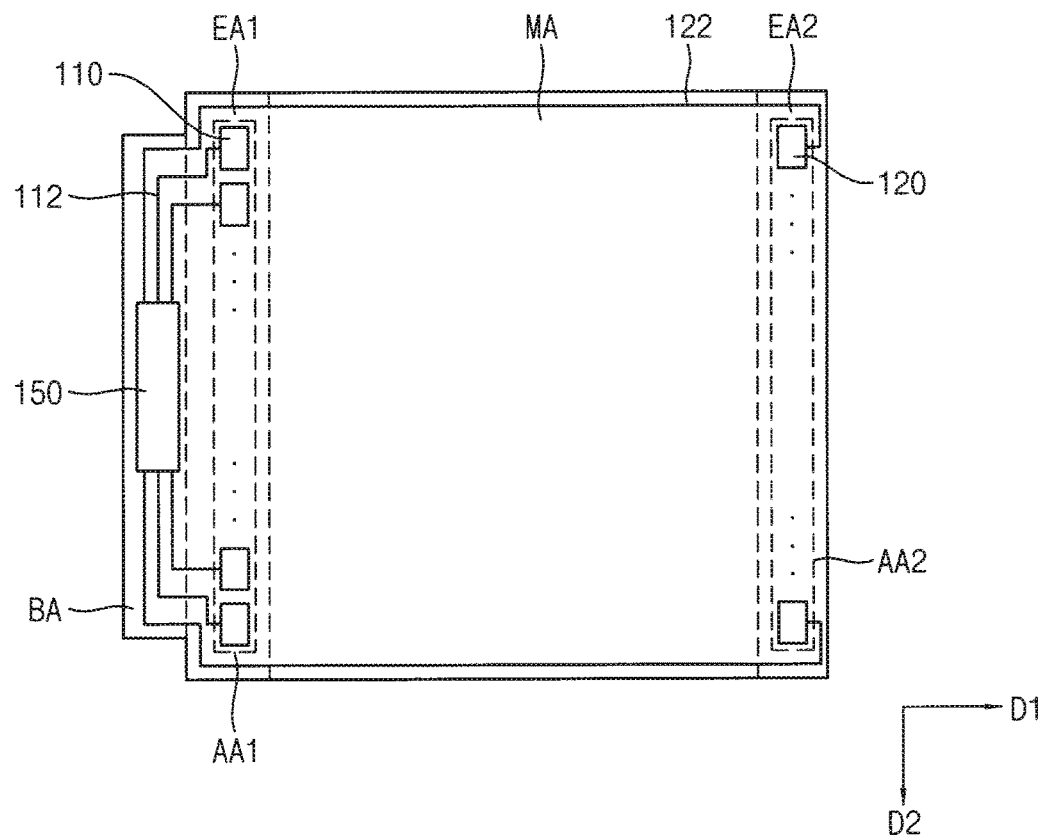
FIG. 2 is a plan diagram illustrating a developed state of the display apparatus of FIG. 1 according to example embodiments of the present inventive concept.
Figure 3:
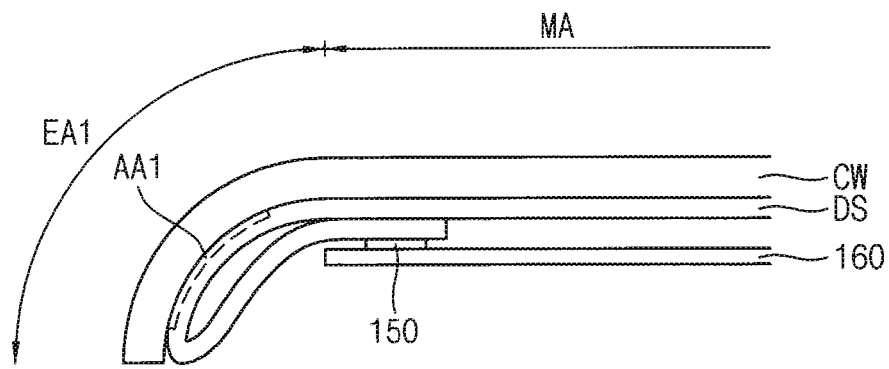
FIG. 3 is a cross-sectional diagram illustrating a first edge display area of the display apparatus of FIG. 1 according to example embodiments of the present inventive concept.

FIG. 1 is a perspective diagram illustrating a display apparatus according to example embodiments, FIG. 2 is a plan diagram illustrating a developed state of the display apparatus of FIG. 1, and FIG. 3 is a cross-sectional diagram illustrating a first edge display area of the display apparatus of FIG. 1.

Referring to FIGS. 1 to 3, the display apparatus may include a display panel structure DS and a cover window CW. The display panel structure DS may include a flexible display panel that displays an image. The display panel structure DS may include a display area in which a plurality of pixels are arranged. The display area may include a lower surface and an upper surface opposite thereto. The display area may include a main display area MA (i.e., a flat display area), and a first edge display area EA1 (i.e., a first curved display area) and a second edge display area EA2 (i.e., a second curved display area) which are adjacent to the main display area MA. For example, the main display area MA may have a rectangular shape extending in a first direction D1 and a second direction D2 perpendicular to the first direction D1, and the first edge display area EA1 and the second edge display area EA2 may extend in the second direction D2 and may be connected to left and right sides (i.e., opposite sides) of the main display area MA in the first direction D1, respectively. The first edge display area EA1 and the second edge display area EA2 may be bent toward a third direction D3 perpendicular to the first direction D1 and the second direction D2. For example, each of the first edge display area EA1 and the second edge display area EA2 may be formed of a curved surface. The upper surface of the display area may include the curved surface.

Although not shown, a peripheral area may be a non-display area (i.e., a pixel-free area) surrounding the display area of the display apparatus.

The first edge display area EA1 may include a first antenna area AA1. A plurality of first antenna elements 110 may be disposed in the first antenna area AA1. For example, four first antenna elements 110 are arranged in the second direction D2 in the first antenna area AA1. The first antenna elements 110 may be formed in the display panel structure DS. For example, an antenna layer in the form of a film including the first antenna element 110 may be formed on the display panel of the display panel structure DS, or the first antenna element 110 may be embedded in the display panel. In addition, a circuit area BA may be connected to the first edge display area EA1.

In an example embodiment, the plurality of first antenna elements 110 are provided to be spaced apart from each other, and a phase of a signal applied to each of the antenna elements may be changed to implement beam forming.

The second edge display area EA2 may include a second antenna area AA2. At least one second antenna element 120 may be disposed in the second antenna area AA2. Similar to the first antenna element 110, the second antenna element 120 may be formed in the display panel structure DS.

The first antenna element 110 and the second antenna element 120 may be electrically connected to a driver 150 disposed in the circuit area BA through feeders (e.g., microstrip feedlines) 112 and 122, respectively. A connection portion between the circuit area BA and the first edge display area EA1 may be folded, so that as shown in FIG. 3, the circuit area BA may be located on a rear side (e.g., a lower surface, opposite to an upper surface) of the first edge display area EA1. The driver 150 may be connected to a driving circuit board 160, and the driving circuit board 160 may be located on a rear side of the main display area MA of the display panel structure DS. (see FIG. 3)

The driver 150 and the driving circuit board 160 may include a radio frequency integrated circuit (RFIC) configured to feed power to the first and second antenna elements 110 and 120. The RFIC may include a high-power amplifier (HPA) and a low-noise amplifier (LNA). For example, a transmission signal transmitted through the HPA may be radiated through the first and second antenna elements 110 and 120, and a reception signal received through the first and second antenna elements 110 and 120 may be amplified through the LNA.

Although one feeder has been described as being connected to one antenna element in the illustrated example, at least two feeders may be connected to one antenna element to perform dual feeding.

Figure 23A:
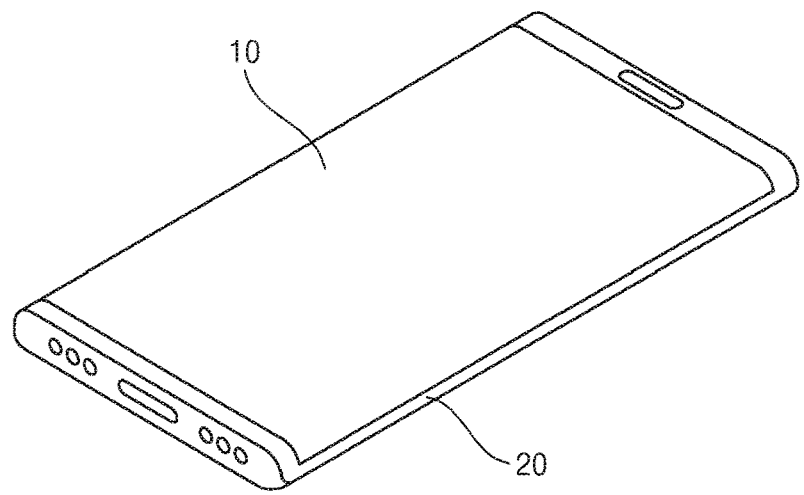
FIGS. 23A to 23F are diagrams illustrating examples in which an electronic apparatus including a display apparatus is implemented as a smart phone according to example embodiments of the present inventive concept.
Figure 23B:
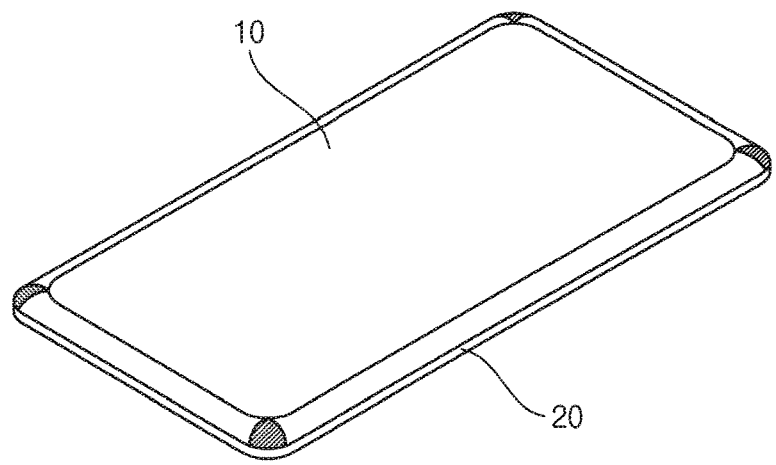
Figure 23C:
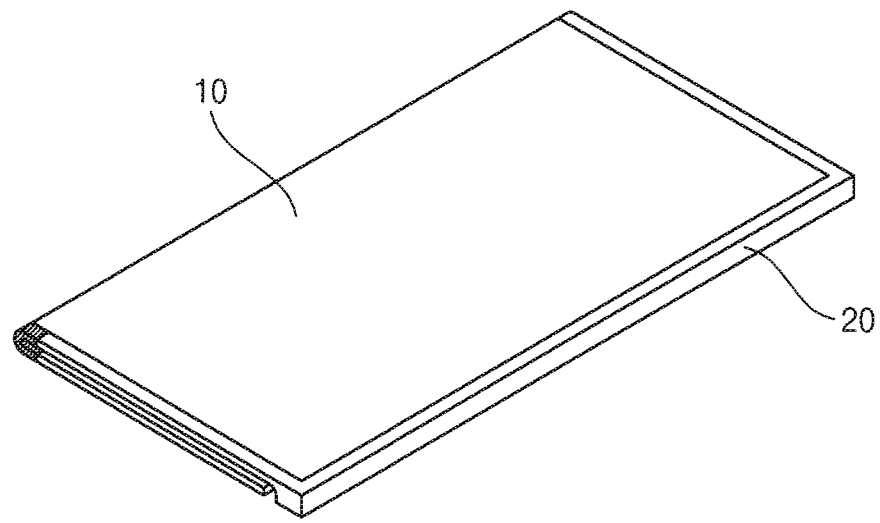
Figure 23D:
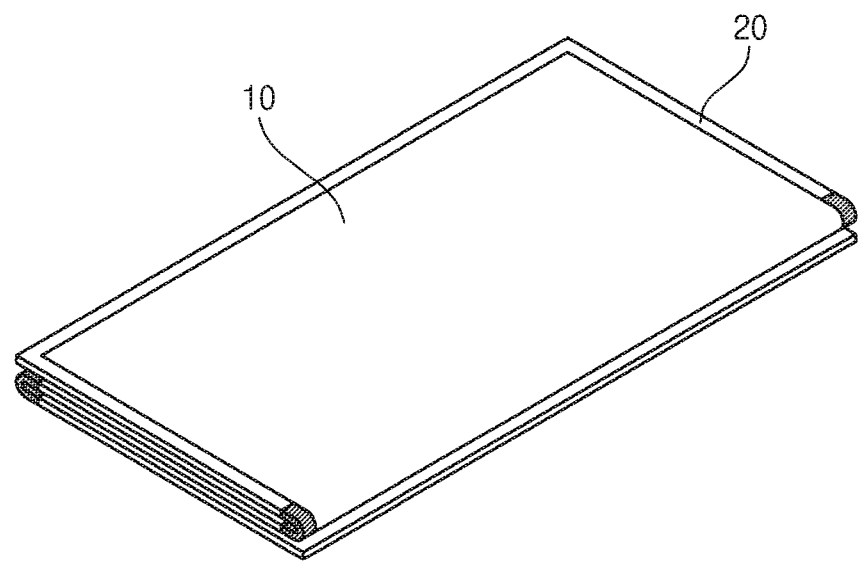
Figure 23E:
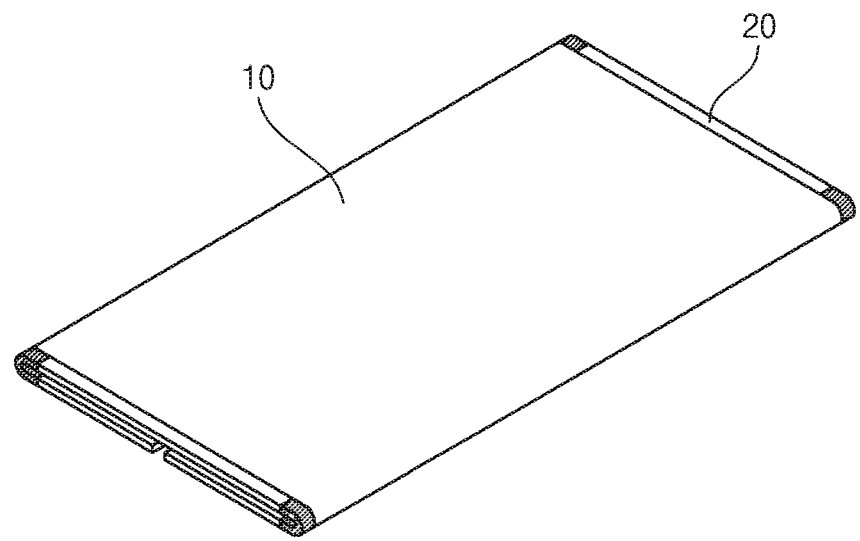
Figure 23F:
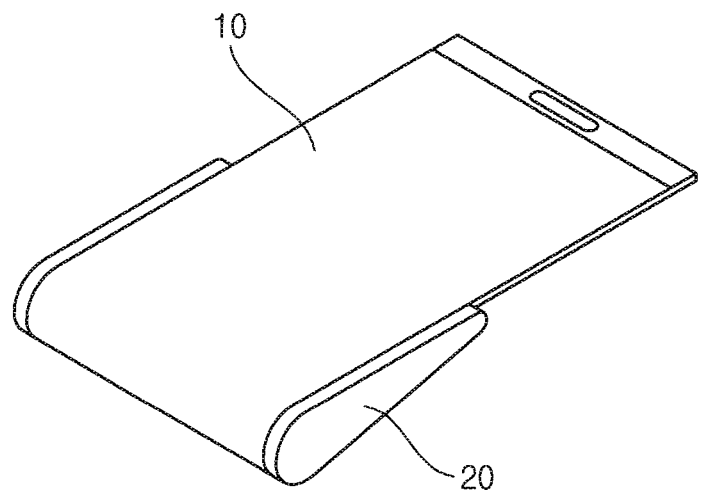

The cover window CW may be disposed on the display panel structure DS. The cover window CW may be attached onto the display panel structure DS by using an adhesive film (not shown). The cover window CW may have curved edge portions to correspond to curved surfaces of the first and second edge display areas EA1 and EA2 of the display panel structure DS. For example, the cover window CW may have a first curved edge portion and a second curved portion overlapping a curved surface of the first edge display area EA1 and a second edge display area EA2, respectively. In an electronic apparatus (e.g., a smart phone) including the display apparatus, the cover window CW may constitute a portion of an outer surface of the electronic apparatus. (see FIG. 23A)

The antenna element of the display apparatus according to example embodiments may be implemented as an antenna for a fourth-generation (4G) communication service. The present invention is not limited thereto. In an example embodiment, the present invention may apply to higher-generation communication service such as a fifth-generation (5G) communication service.

In this regard, a frequency of 2 GHz or less is mainly used for 4G mobile communication, while a (ultra-)high-band frequency of about 28 GHz or 39 GHz is used for 5G mobile communication unlike 4G Long Term Evolution (LTE). A low-band frequency has a long wavelength and thus a wide coverage, but communication using the low-band frequency has a relatively narrow bandwidth and thus a low transmission rate. Meanwhile, the high-band frequency has a short wavelength and thus a narrow coverage, but communication using the high-band frequency has a relatively wide bandwidth and thus a high transmission rate. In addition, the communication using the high-band frequency may resolve coverage constraints to some extent by using an electromagnetic wave with high-linearity propagation characteristics, an array antenna, and the like. Therefore, the 5G mobile communication may solve the problem of insufficient capacity by increasing the bandwidth, provide various communication services to a user, and provide a mobile Internet technology and a machine-to-machine (M2M) technology.

A conventional printed antenna implemented on a circuit board or a conventional chip antenna disposed on the circuit board is used for radiation of an antenna for 5G mobile communication with performance degradation of the antenna for 5G mobile communication. For example, the printed antenna or the chip antenna has a very high loss in a 5G frequency band (e.g., 28 GHz or 39 GHz band).

In an example embodiment, the display apparatus may include the first and second edge display areas each of which having a curved surface, and the first and second edge display areas may include the first and second antenna areas in which the antenna elements are disposed, respectively. Accordingly, in the electronic apparatus (e.g., a smart phone) including the display apparatus, an antenna element may be disposed even on a side surface of the electronic apparatus surrounded by the display area of the display apparatus.

Meanwhile, generally, in the electronic apparatus, an antenna for cellular communication is disposed in a housing (see 20 of FIG. 23A) in the form of Antenna-in-Package (AiP). As the display area expands, the display apparatus may cover the antenna in the form of AiP, which causes antenna performance to degrade.

In an example embodiment, the antenna element may be disposed even at curved portions on left and right sides of the electronic apparatus without degrading performance of the antenna element. For example, the arrangement of the antenna element according to the present invention increase the antenna performance compared to the form of AiP.

Figure 4:
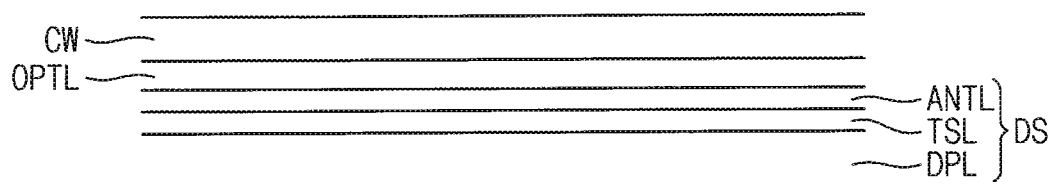
FIG. 4 is a cross-sectional diagram illustrating a stacked structure of a display apparatus according to example embodiments of the present inventive concept.

FIG. 4 is a cross-sectional diagram illustrating a stacked structure of a display apparatus according to example embodiments.

Referring to FIG. 4, the display apparatus may include a flexible display panel DPL, a touch electrode layer TSL, an antenna layer ANTL, an optical layer OPTL, and a cover window CW.

The flexible display panel DPL may be a flexible display panel. For example, the flexible display panel DPL may be an organic light emitting diode display device (OLED) including a flexible substrate. The present invention is not limited thereto. In an example embodiment, the flexible display panel DPL may include a liquid crystal display device (LCD), a field emission display device (FED), a plasma display device (PDP), or an electrophoretic image display device (EPD), which includes a flexible substrate.

The touch electrode layer TSL may be disposed on the flexible display panel DPL. The touch electrode layer TSL may include a touch sensor. The touch electrode layer TSL may be implemented in the form of a film including the touch electrode. When the touch electrode layer TSL is implemented in the form of a film, the touch electrode layer TSL may be attached onto the flexible display panel DPL by using a pressure sensitive adhesive (PSA). The present invention is not limited thereto. In an example embodiment of on-cell touch technology, the touch electrode of the touch electrode layer TSL may be directly formed on an uppermost layer of the flexible display panel DPL through patterning. For example, the flexible display panel DPL may include a flexible substrate, a thin film transistor formed on the flexible substrate, an organic light emitting element electrically connected to the thin film transistor, and a thin film encapsulation layer which covers the organic light emitting element, and the touch electrode may be formed on the thin film encapsulation layer, which is the uppermost layer of the flexible display panel DPL.

The antenna layer ANTL may be disposed on the touch electrode layer TSL. The antenna layer ANTL may include antenna elements (see 110 and 120 of FIG. 2) and feeders (see 112 and 122 of FIG. 2). The antenna layer ANTL may be implemented in the form of a film including the antenna element and the feeders. When the antenna layer ANTL is implemented in the form of a film, the antenna layer ANTL may be attached onto the touch electrode layer TSL by using a PSA. The present invention is not limited thereto. In an example embodiment, the antenna element and the feeders of the antenna layer ANTL may be directly formed on the touch electrode layer TSL through the patterning.

The optical layer OPTL may be disposed on the antenna layer ANTL. The optical layer OPTL may be, for example, a polarizer for reducing reflection of external light. The optical layer OPTL may be implemented in the form of a film, and may be attached onto the antenna layer ANTL by using a PSA.

The cover window CW may be disposed on the optical layer OPTL. The cover window CW may be glass having a curved edge portion. The present invention is not limited thereto. In an example embodiment, the cover window CW may be a transparent flexible film such as ultra-thin film glass and transparent polyimide. The cover window CW may be attached onto the optical layer OPTL by using a PSA.

Here, the flexible display panel DPL, the touch electrode layer TSL, and the antenna layer ANTL may constitute the display panel structure DS, and a stacking order of the layers may change to form the flexible display panel DPL according to the present invention.

Figure 5:
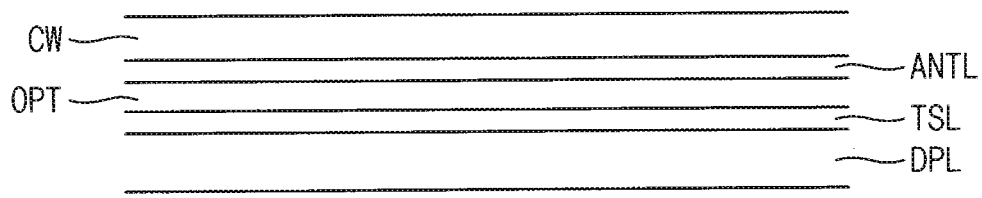
FIG. 5 is a cross-sectional diagram illustrating a stacked structure of a display apparatus according to example embodiments of the present inventive concept.

FIG. 5 is a cross-sectional diagram illustrating a stacked structure of a display apparatus according to example embodiments.

Referring to FIG. 5, the display apparatus may include a flexible display panel DPL, a touch electrode layer TSL, an optical layer OPTL, an antenna layer ANTL, and a cover window CW. The display apparatus is substantially the same as the display apparatus of FIG. 4 except that the antenna layer ANTL is disposed on the optical layer OPTL. Therefore, redundant descriptions thereof will be omitted.

The flexible display panel DPL may be a flexible display panel. The touch electrode layer TSL may be disposed on the flexible display panel DPL. The optical layer OPT may be disposed on the touch electrode layer TSL. The antenna layer ANTL may be disposed on the optical layer OPT. The cover window CW may be disposed on the antenna layer ANTL.

Here, the antenna layer ANTL is disposed at an uppermost layer among the layers except for the cover window CW. For example, the antenna element of the antenna layer ANTL in FIG. 5 may have increased performance compared to the antenna element in FIG. 4. Meanwhile, a pattern of the antenna layer ANTL may be formed of a transparent conductive material having a low external light reflectance to the extent that the user may not visually recognize the pattern of the antenna layer ANTL.

Figure 6:
FIG. 6 is a cross-sectional diagram illustrating a stacked structure of a display apparatus according to example embodiments of the present inventive concept.
Figure 7A:
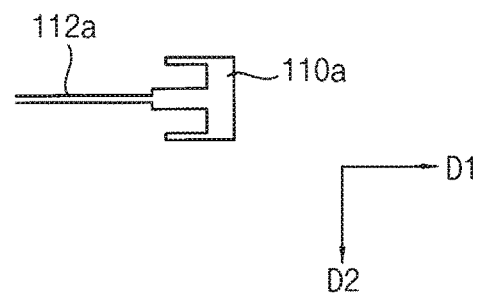
FIGS. 7A to 7D are diagrams for describing antenna elements of a display apparatus according to example embodiments of the present inventive concept.
Figure 7B:
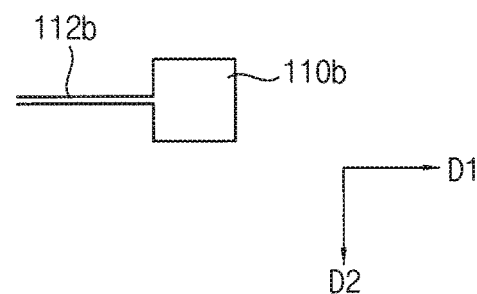
Figure 7C:
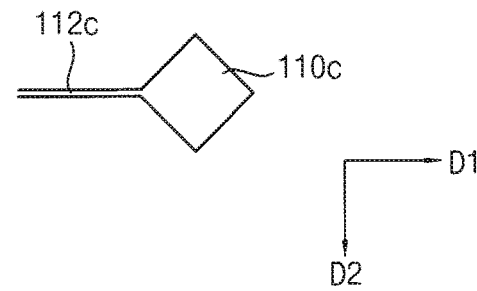
Figure 7D:
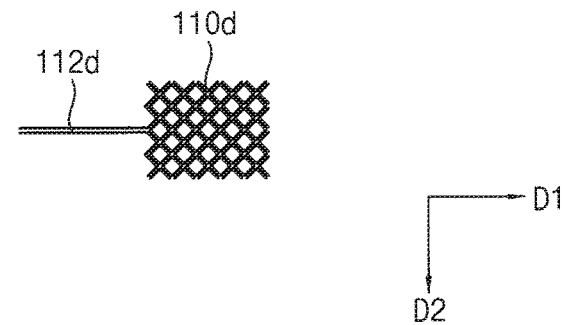

FIG. 6 is a cross-sectional diagram illustrating a stacked structure of a display apparatus according to example embodiments.

Referring to FIG. 6, the display apparatus may include a flexible display panel DPL and a cover window CW.

The display apparatus is substantially the same as the display apparatus of FIG. 4 except that the touch electrode layer, the antenna layer, the optical layer, and the like except for the cover window CW are embedded in the flexible display panel DPL. Therefore, redundant descriptions thereof will be omitted.

The flexible display panel DPL may include the touch electrode layer and the antenna layer. The flexible display panel DPL may further include an optical layer. In the manufacture of the flexible display panel DPL, the touch electrode layer and the antenna layer may be formed by forming a conductive layer on a flexible substrate and patterning the conductive layer, and the like.

FIGS. 7A to 7D are diagrams for describing antenna elements of a display apparatus according to example embodiments.

Referring to FIGS. 7A to 7D, the antenna element may be a microstrip patch antenna. The antenna element may include radiation patterns 110a, 110b, 110c, and 110d and feeders (i.e., feedlines) 112a, 112b, 112c, and 112d configured to supply signals to the radiation patterns. The radiation patterns and the feeders of the antenna element may be configured as a conductive layer disposed between insulating layers.

The radiation pattern may be implemented in the form of a lattice or mesh. (see FIG. 7D). The radiation pattern may have a rectangular shape or various shapes, may have sides parallel to the first direction D1 and the second direction D2, or may be inclined with respect to the first direction D1 and the second direction D2. The shape and size of the radiation pattern may be appropriately designed according to a frequency domain used by the antenna element.

The conductive layer may include silver (Ag), gold (Au), copper (Cu), aluminum (Al), platinum (Pt), palladium (Pd), chromium (Cr), titanium (Ti), tungsten (W), niobium (Nb), tantalum (Ta), vanadium (V), iron (Fe), manganese (Mn), cobalt (Co), nickel (Ni), zinc (Zn), tin (Sn), or an alloy thereof. These may be used alone, or at least two of the materials may be used in combination with each other. In addition, the conductive layer may be formed by using transparent metal oxide such as indium tin oxide (ITO), indium zinc oxide (IZO), indium zinc tin oxide (ITZO), and zinc oxide ($ZnO_x$).

When the antenna element is implemented with silver (Ag), the antenna element has excellent transparency and excellent electrical characteristics such as antenna radiation characteristics. In addition, silver (Ag) may be implemented with the narrowest line width, and the lattice (or mesh) may be implemented with the finest spacing. Therefore, in a millimeter-wave band of a 28 GHz or 39 GHz frequency band, the antenna element and the feeder having a narrow line width may be designed by using silver.

Meanwhile, the antenna element and the feeder may be implemented in the form of a metal mesh. For example, the antenna element and the feeder may be implemented such that the metal mesh is electrically connected, and the metal mesh is removed in a dielectric area in which the antenna element and the feeder are not provided. Alternatively, a dummy metal mesh may be adjacent to the antenna element and the feeder even in the dielectric area to the extent that the dummy metal mesh does not electrically affect the antenna element and the feeder. The dummy metal mesh disposed in the dielectric area is not an area in which a signal is transmitted or radiated, and the dummy metal mesh may be uniformly disposed over an entire area of the display apparatus to increase visibility of the display apparatus.

Figure 8:
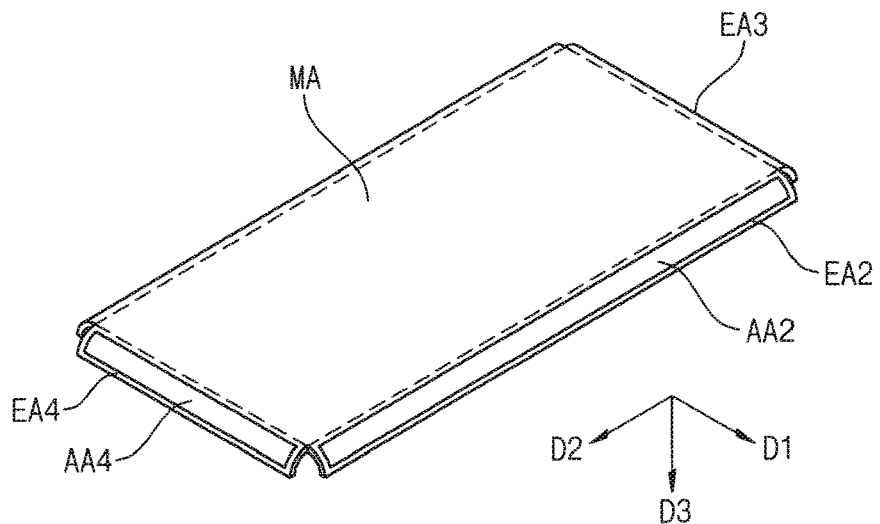
FIG. 8 is a perspective diagram illustrating a display apparatus according to example embodiments of the present inventive concept.
Figure 9:
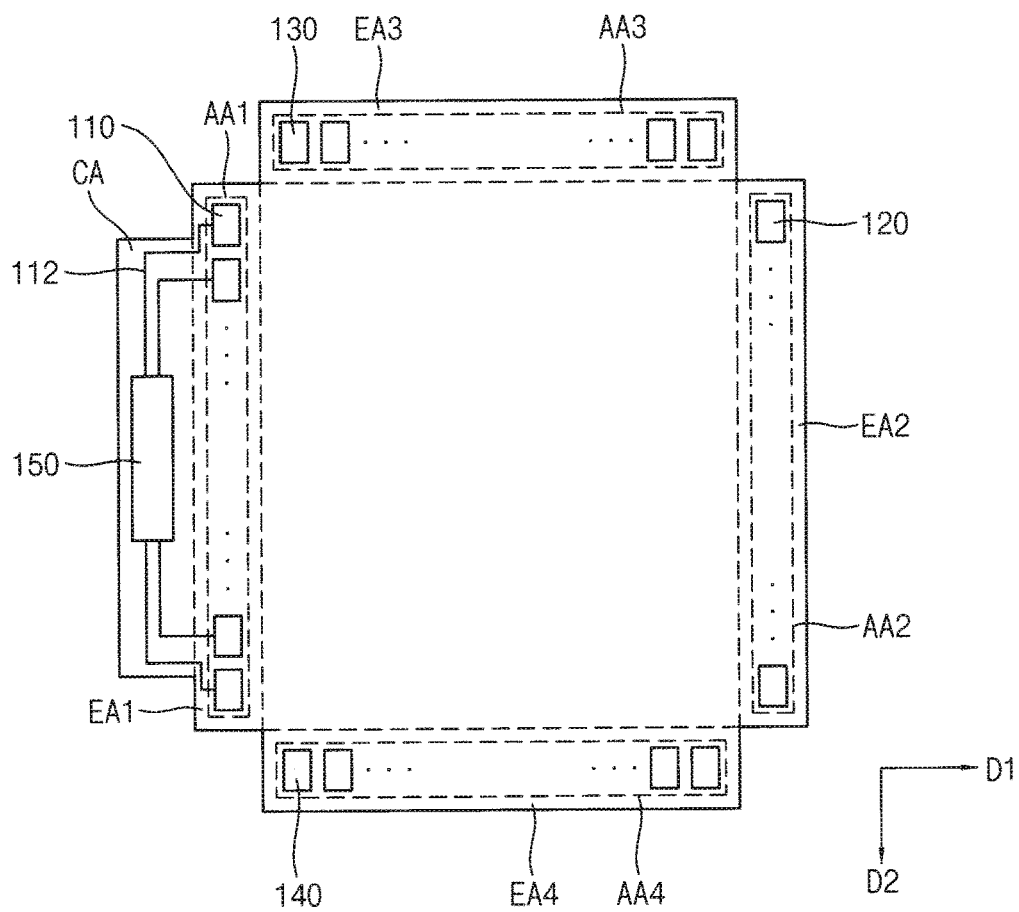
FIG. 9 is a plan diagram illustrating a developed state of the display apparatus of FIG. 8 according to example embodiments of the present inventive concept.

FIG. 8 is a perspective diagram illustrating a display apparatus according to example embodiments, and FIG. 9 is a plan diagram illustrating a developed state of the display apparatus of FIG. 8.

Referring to FIGS. 8 and 9, the display apparatus is substantially the same as the display apparatus of FIGS. 1 to 3 except that the display area of the display panel structure DS further includes a third edge display area EA3 and a fourth edge display area EA4. Therefore, redundant descriptions thereof will be omitted.

The display apparatus may include a display panel structure DS and a cover window CW. The display panel structure DS may include a flexible display panel that displays an image. The display panel structure DS may include a display area. The display area may include a main display area MA, and a first edge display area EA1, a second edge display area EA2, a third edge display area EA3, and a fourth edge display area EA4 which are adjacent to the main display area MA.

For example, the main display area MA may have a rectangular shape extending in the first direction D1 and the second direction D2 perpendicular to the first direction D1. The first edge display area EA1 and the second edge display area EA2 may extend in the second direction D2, and may be connected to left and right sides of the main display area MA in the first direction D1, respectively. The first edge display area EA1 and the second edge display area EA2 may be bent in a third direction D3 perpendicular to the first direction D1 and the second direction D2 to have a curved surface.

The third edge display area EA3 and the fourth edge display area EA4 may extend in the first direction D1, and may be connected to upper and lower sides of the main display area MA in the second direction D2, respectively. The third edge display area EA3 and the fourth edge display area EA4 may be bent in the third direction D3 to have a curved surface.

The first edge display area EA1 may include a first antenna area AA1. At least one first antenna element 110 may be disposed in the first antenna area AA1.

The second edge display area EA2 may include a second antenna area AA2. At least one second antenna element 120 may be disposed in the second antenna area AA2.

The third edge display area EA3 may include a third antenna area AA3. At least one third antenna element 130 may be disposed in the third antenna area AA3.

The fourth edge display area EA4 may include a fourth antenna area AA4. At least one fourth antenna element 140 may be disposed in the fourth antenna area AA4.

The first antenna element 110 may be electrically connected to a driver 150 disposed in a circuit area BA through the feeder 112. Each of the second to fourth antenna elements 120, 130 and 140 may be electrically connected to the driver through a corresponding feeder. For the simplicity of drawing, those connections are omitted.

Figure 10:
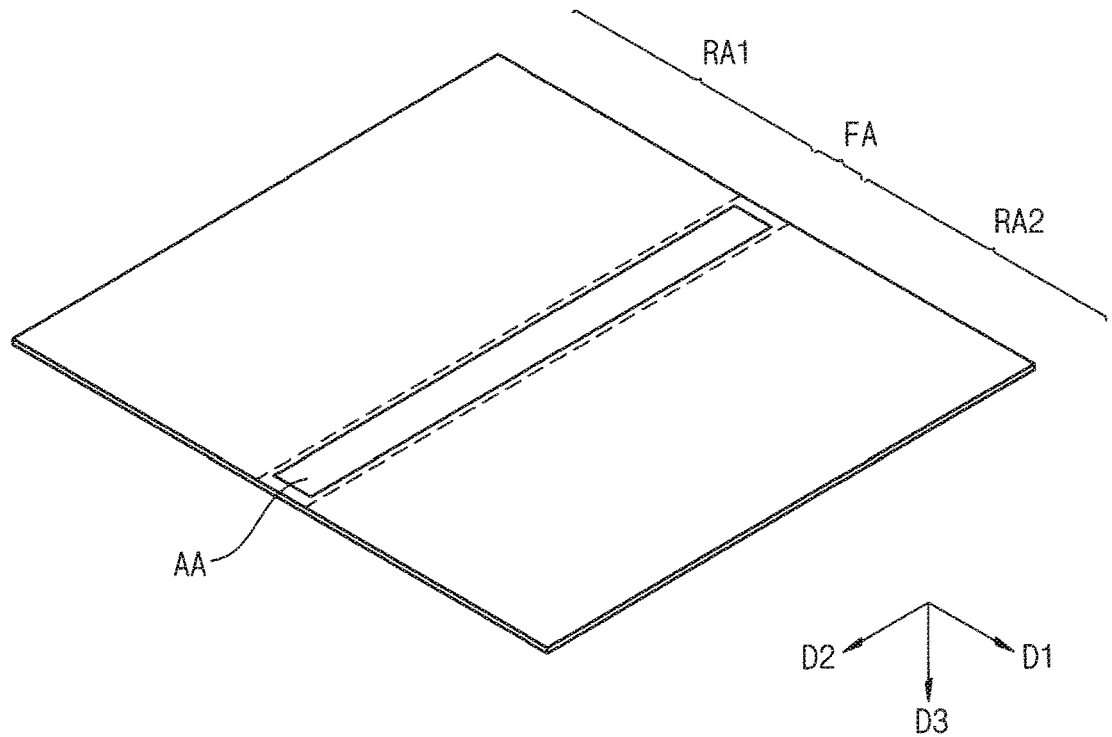
FIG. 10 is a perspective diagram illustrating a display apparatus according to example embodiments of the present inventive concept.
Figure 11:
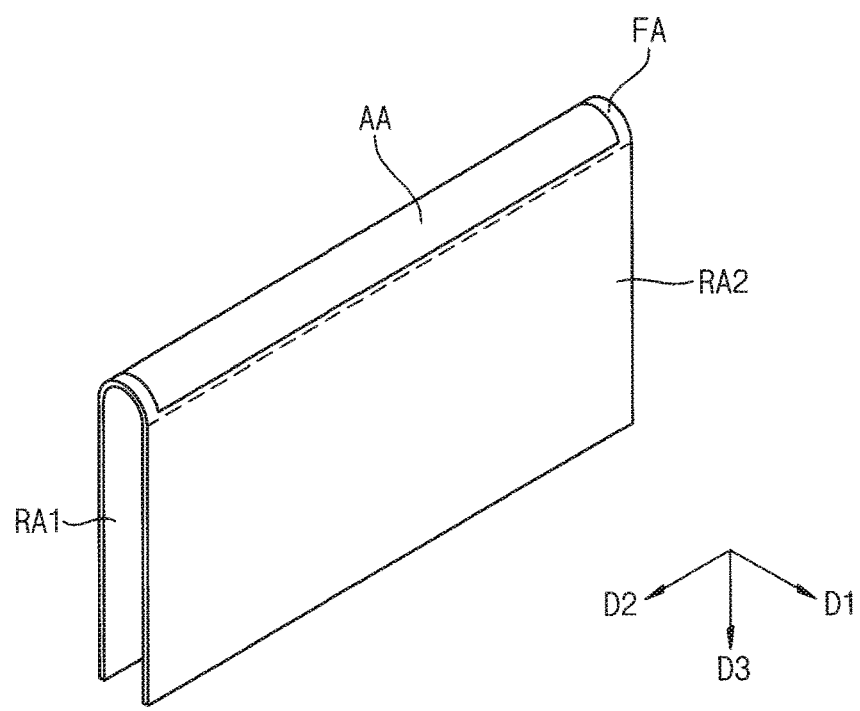
FIG. 11 is a perspective diagram illustrating a folded state of the display apparatus of FIG. 10 according to example embodiment of the present inventive concept.

FIG. 10 is a perspective diagram illustrating a display apparatus according to example embodiments, and FIG. 11 is a perspective diagram illustrating a folded state of the display apparatus of FIG. 10.

Referring to FIGS. 10 and 11, the display apparatus may be a foldable display apparatus which may be folded and unfolded as necessary, in which the display apparatus, when folded, has a small volume (see FIG. 11) or when unfolded, provides a larger screen (see FIG. 10). In this embodiment, the display apparatus may be an out-folding type foldable display apparatus in which a display surface that displays an image may be located on an outer side in a folded state.

The display apparatus may include a display area and a non-display area (not shown) surrounding the display area, and the display area may include a first non-folding area RA1, a second non-folding area RA2 spaced apart from the first non-folding area RA1 in the first direction D1, and a folding area FA disposed between the first non-folding area RA1 and the second non-folding area RA2.

Accordingly, the display apparatus may be folded and unfolded by bending the folding area FA, and the out-folding type foldable display apparatus in which the display surface that displays an image is located on the outer side in the folded state may be implemented.

Here, the folding area FA may include an antenna area AA in which an antenna element is disposed. Accordingly, the antenna area AA may be disposed on the outer side in a state where the display apparatus is folded to have increased antenna performance.

Meanwhile, in this embodiment, the display apparatus has been described as being the out-folding type foldable display apparatus, but the display apparatus may be implemented as an in-folding type display apparatus in which a display sub-surface that displays an image is located on an inner side in the folded state. For example, the folding area may include the antenna area in which the antenna element is disposed.

Figure 12:
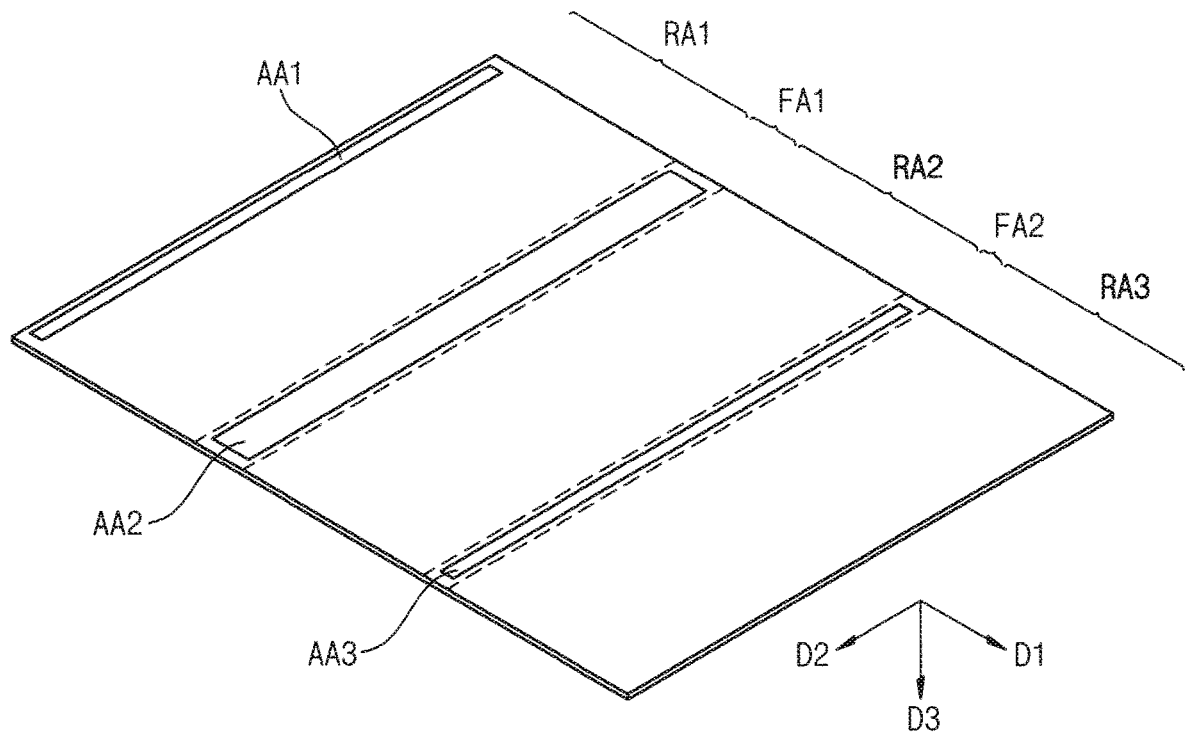
FIG. 12 is a perspective diagram illustrating a display apparatus according to example embodiments of the present inventive concept.
Figure 13:
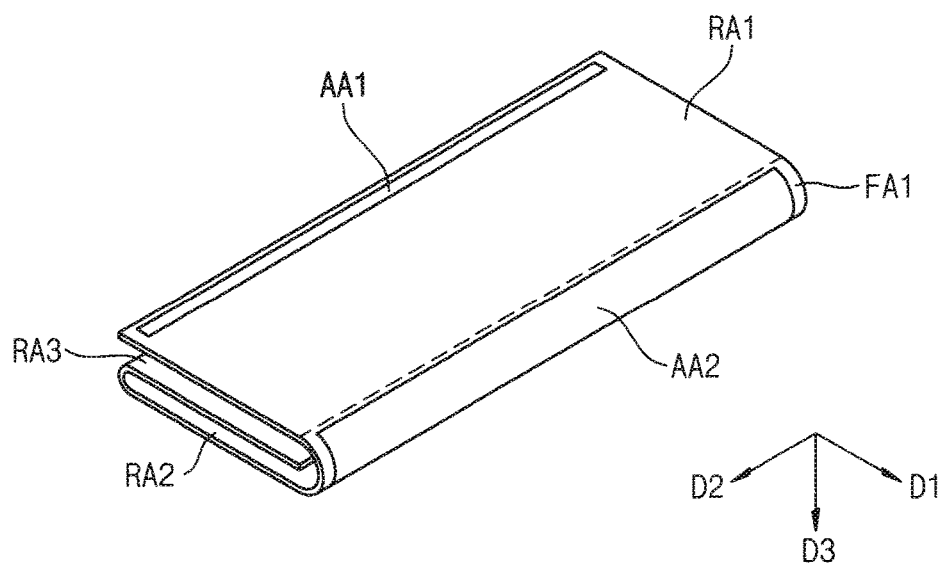
FIG. 13 is a perspective diagram illustrating a folded state of the display apparatus of FIG. 12 according to example embodiments of the present inventive concept.
Figure 14:
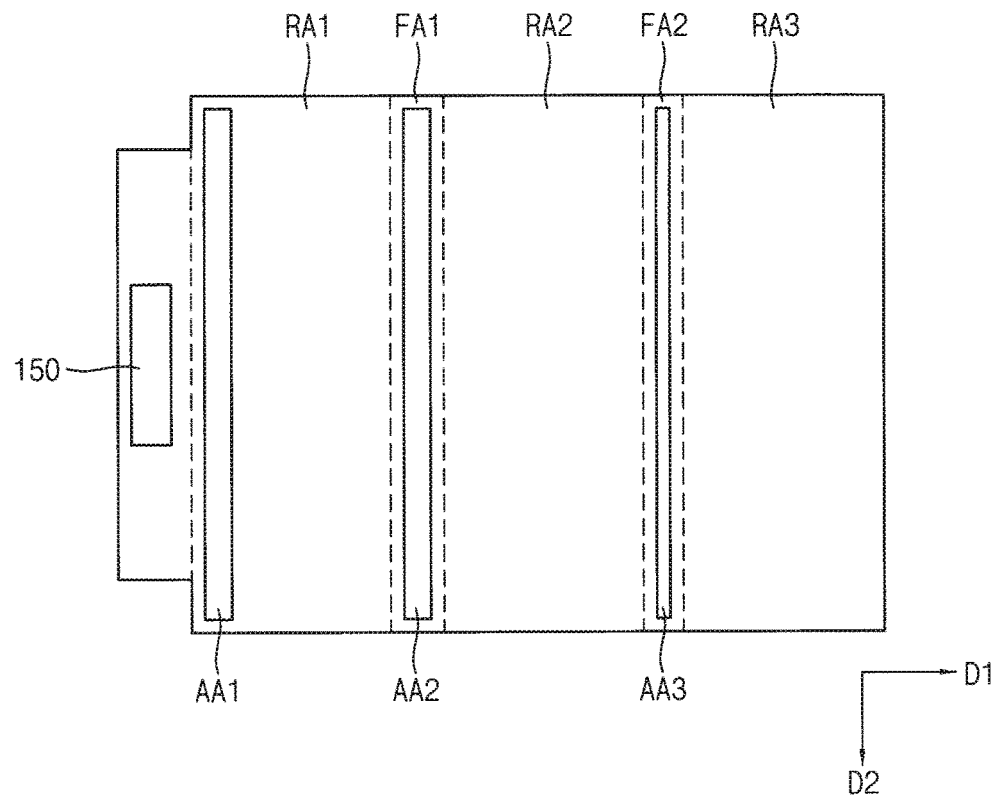
FIG. 14 is a plan diagram illustrating a developed state of the display apparatus of FIG. 12 according to example embodiments of the present inventive concept.

FIG. 12 is a perspective diagram illustrating a display apparatus according to example embodiments, FIG. 13 is a perspective diagram illustrating a folded state of the display apparatus of FIG. 12, and FIG. 14 is a plan diagram illustrating a developed state of the display apparatus of FIG. 12.

Referring to FIGS. 12 to 14, the display apparatus may be a foldable display apparatus which may be folded, in which the display apparatus is folded to have a small volume (see FIG. 13) or unfolded to implement a large screen (see FIG. 12). In this embodiment, the display apparatus may be a multi-foldable type foldable display apparatus which may be folded at both sides thereof.

The display apparatus may include a display area and a non-display area surrounding the display area (not shown), and the display area may include a first non-folding area RA1, a second non-folding area RA2 spaced apart from the first non-folding area RA1 in the first direction D1, a third non-folding area RA3 spaced apart from the first non-folding area RA1 in the first direction D1, a first folding area FA1 disposed between the first non-folding area RA1 and the second non-folding area RA2, and a second folding area FA2 disposed between the second non-folding area RA2 and the third non-folding area RA3.

Accordingly, the display apparatus may be folded and unfolded by bending the first and second folding areas FA1 and FA2 outward of the display surface, and a multi-foldable type foldable display apparatus in which the first non-folding area RA1, the second non-folding area RA2, and the third non-folding area RA3 overlap each other in the folded state may be implemented.

Here, the first non-folding area RA1 may include a first antenna area AA1 which is provided with a first antenna element and located on an opposite side of the first folding area FA1. The first folding area FA1 may include a second antenna area AA2 in which a second antenna element is disposed. The second folding area FA2 may include a third antenna area AA3 in which a third antenna element is disposed.

Accordingly, the first to third antenna areas AA1, AA2, and AA3 may be disposed on an outer side in a state where the display apparatus is folded (see FIG. 13), so that the antenna performance can be improved. In particular, the second antenna element in the second antenna area AA2 may be advantageous for transmitting and receiving a radio wave in a rightward direction (D1 of FIG. 13) of the display apparatus in the folded state, the third antenna element in the third antenna area AA3 may be advantageous for transmitting and receiving a radio wave in a leftward direction (direction opposite to D1 of FIG. 13) of the display apparatus in the folded state, and the first antenna element in the first antenna area AA1 may be advantageous for transmitting and receiving a radio wave in a forward direction (direction opposite to D3 of FIG. 13) of the display apparatus in the folded state.

Meanwhile, the first to third antenna elements may be electrically connected to a driver 150 disposed in a circuit area BA through feeders (not shown). A connection portion between the circuit area BA and the first non-folding area RA1 may be folded, so that the circuit area BA may be located on a rear side of the first non-folding area RA1. (see FIG. 3)

Since components of the display apparatus may be substantially the same as the components of the display apparatus of FIGS. 1 to 4, respectively, redundant descriptions thereof will be omitted.

Figure 15:
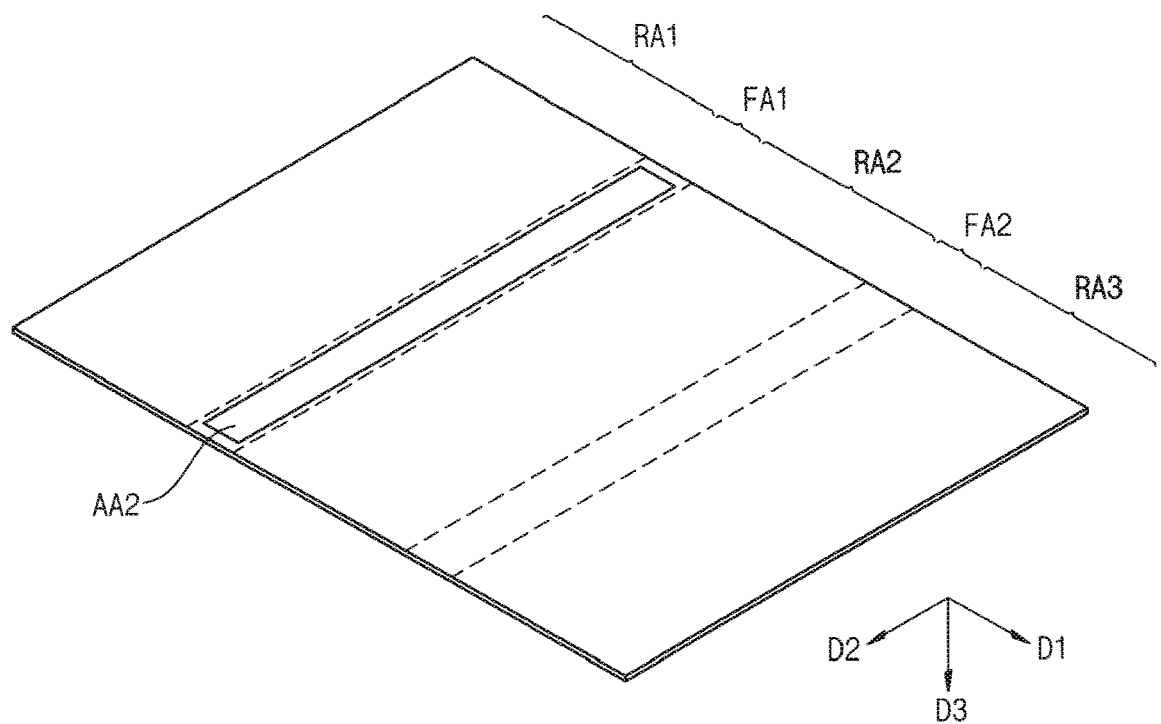
FIG. 15 is a perspective diagram illustrating a display apparatus according to example embodiments of the present inventive concept.
Figure 16:
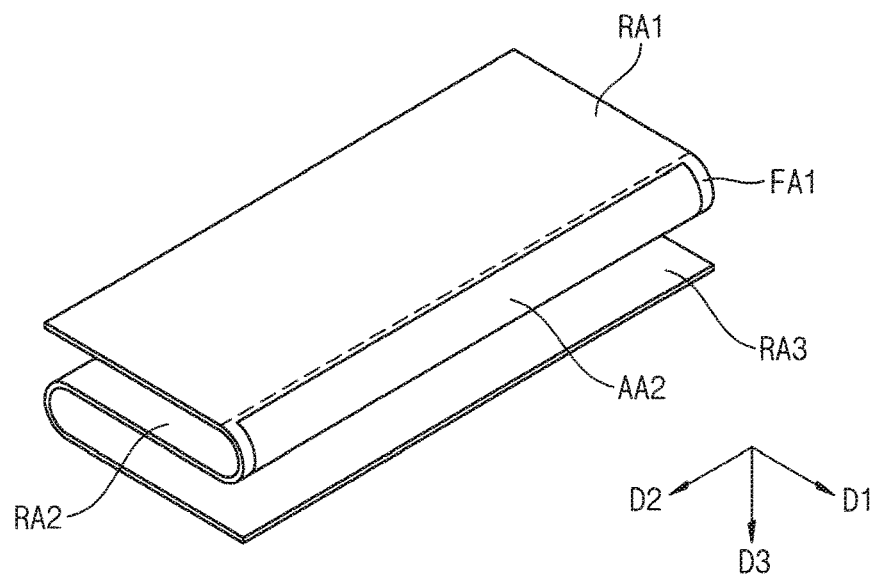
FIG. 16 is a perspective diagram illustrating a folded state of the display apparatus of FIG. 15 according to example embodiments of the present inventive concept.

FIG. 15 is a perspective diagram illustrating a display apparatus according to example embodiments, and FIG. 16 is a perspective diagram illustrating a folded state of the display apparatus of FIG. 15.

Referring to FIGS. 15 and 16, the display apparatus may be a foldable display apparatus which may be folded, in which the display apparatus is folded to have a small volume (see FIG. 16) or unfolded to implement a large screen (see FIG. 15). In this embodiment, the display apparatus may be a multi-foldable type foldable display apparatus which may be folded at both sides thereof.

The display apparatus may include a display area and a non-display area surrounding the display area (not shown), and the display area may include a first non-folding area RA1, a second non-folding area RA2 spaced apart from the first non-folding area RA1 in the first direction D1, a third non-folding area RA3 spaced apart from the first non-folding area RA1 in the first direction D1, a first folding area FA1 disposed between the first non-folding area RA1 and the second non-folding area RA2, and a second folding area FA2 disposed between the second non-folding area RA2 and the third non-folding area RA3.

Accordingly, the display apparatus may be folded and unfolded by bending the first folding area FA1 outward of the display surface and bending the second folding area FA2 inward of the display surface, and a multi-foldable type foldable display apparatus in which the first non-folding area RA1, the second non-folding area RA2, and the third non-folding area RA3 overlap each other in the folded state may be implemented.

Here, the first folding area FA1 may include an antenna area AA in which an antenna element is disposed.

Accordingly, the antenna area AA may be disposed on an outer side in a state where the display apparatus is folded (see FIG. 16), so that the antenna performance can be improved. In particular, the antenna element in the antenna area AA may be advantageous for transmitting and receiving a radio wave in a rightward direction (D1 of FIG. 16) of the display apparatus in the folded state.

Figure 17:
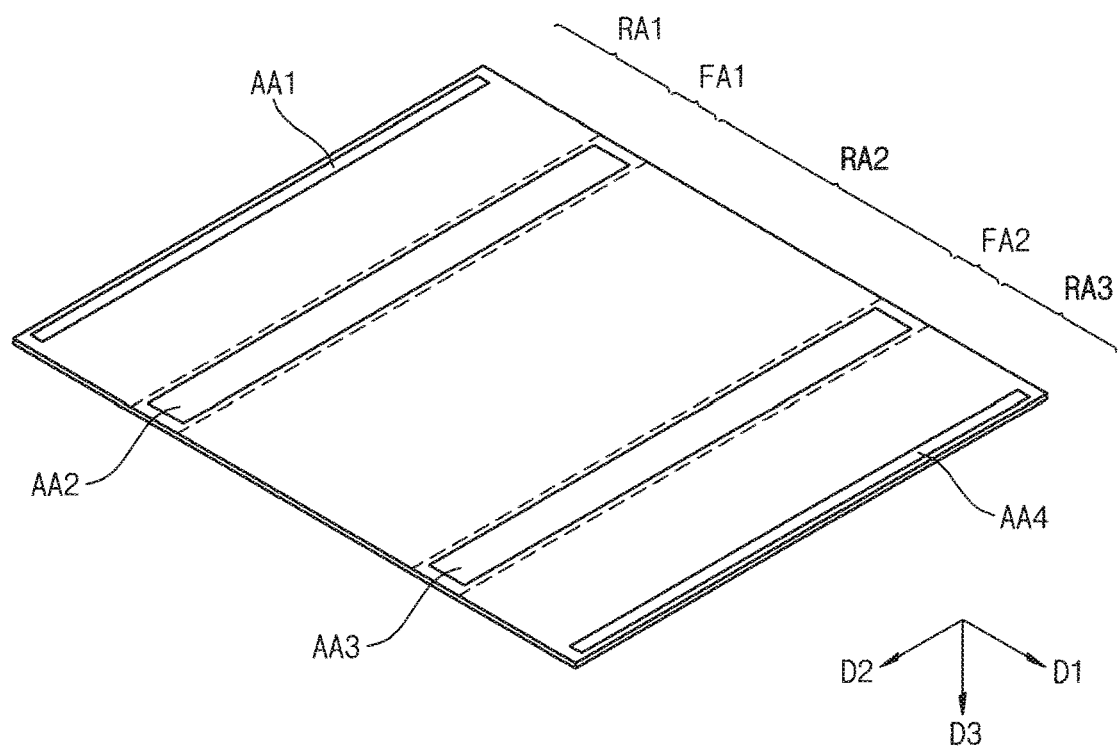
FIG. 17 is a perspective diagram illustrating a display apparatus according to example embodiments of the present inventive concept.
Figure 18:
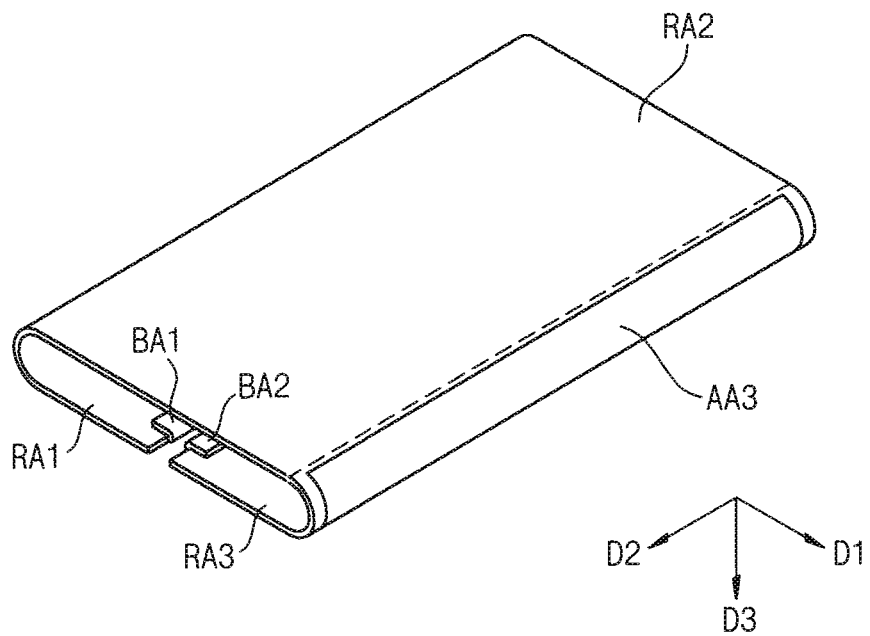
FIG. 18 is a perspective diagram illustrating a folded state of the display apparatus of FIG. 17 according to example embodiments of the present inventive concept.
Figure 19:
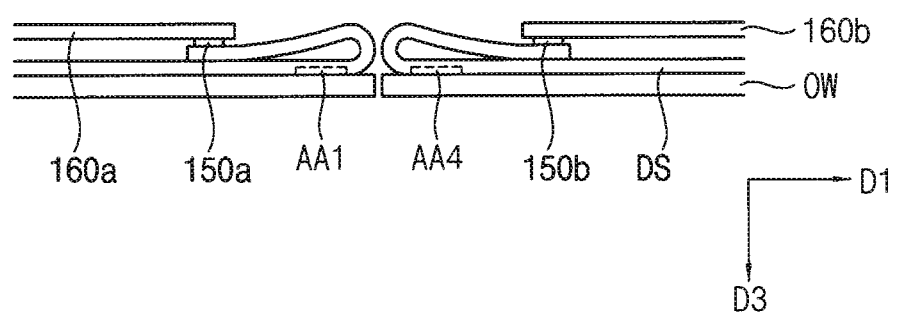
FIG. 19 is a cross-sectional diagram illustrating a portion where a first non-folding area and a third non-folding area in the display apparatus of FIG. 18 meet each other according to example embodiments of the present inventive concept.

FIG. 17 is a perspective diagram illustrating a display apparatus according to example embodiments, FIG. 18 is a perspective diagram illustrating a folded state of the display apparatus of FIG. 17, and FIG. 19 is a cross-sectional diagram illustrating a portion where a first non-folding area and a third non-folding area in the display apparatus of FIG. 18 meet each other.

Referring to FIGS. 17 to 19, the display apparatus may be a foldable display apparatus which may be folded, in which the display apparatus is folded to have a small volume (see FIG. 18) or unfolded to implement a large screen (see FIG. 17). In this embodiment, the display apparatus may be a multi-foldable type foldable display apparatus which may be folded at both sides thereof.

The display apparatus may include a display area and a non-display area surrounding the display area (not shown), and the display area may include a first non-folding area RA1, a second non-folding area RA2 spaced apart from the first non-folding area RA1 in the first direction D1, a third non-folding area RA3 spaced apart from the first non-folding area RA1 in the first direction D1, a first folding area FA1 disposed between the first non-folding area RA1 and the second non-folding area RA2, and a second folding area FA2 disposed between the second non-folding area RA2 and the third non-folding area RA3.

Here, the first non-folding area RA1 may include a first antenna area AA1 which is provided with a first antenna element and located on an opposite side of the first folding area FA1. The first folding area FA1 may include a second antenna area AA2 in which a second antenna element is disposed. The second folding area FA2 may include a third antenna area AA3 in which a third antenna element is disposed. The third non-folding area RA3 may include a fourth antenna area AA4 which is provided with a fourth antenna element and located on an opposite side of the second folding area FA2.

The first antenna element and the second antenna element may be electrically connected to a first driver 150*a* disposed in a first circuit area BA1 through feeders, respectively. A connection portion between the first circuit area BA1 and the first non-folding area RA1 may be folded, so that the first circuit area BA1 may be located on a rear side of the first non-folding area RA1. The first driver 150*a* may be connected to a first driving circuit board 160*a*. In addition, the third antenna element and the fourth antenna element may be electrically connected to a second driver 150*b* disposed in a second circuit area BA2 through feeders, respectively. A connection portion between the second circuit area BA2 and the third non-folding area RA3 may be folded, so that the second circuit area BA2 may be located on a rear side of the third non-folding area RA3. The second driver 150*b* may be connected to a second driving circuit board 160*b*. (see FIG. 19)

Figure 20:
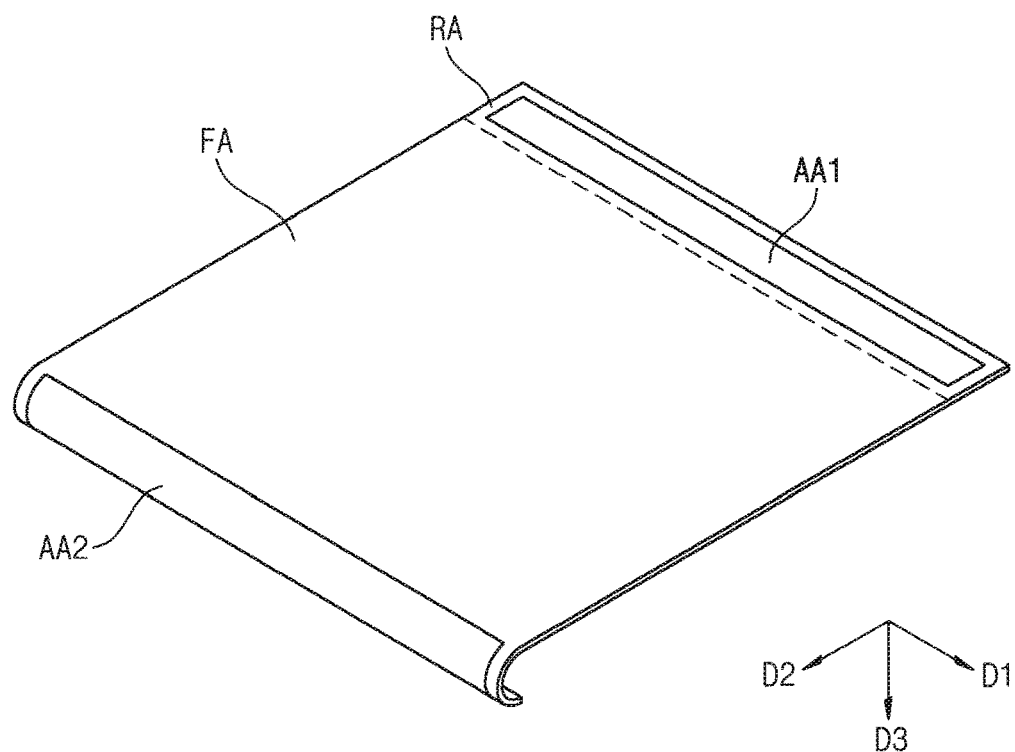
FIG. 20 is a perspective diagram illustrating a display apparatus according to example embodiments of the present inventive concept.
Figure 21:
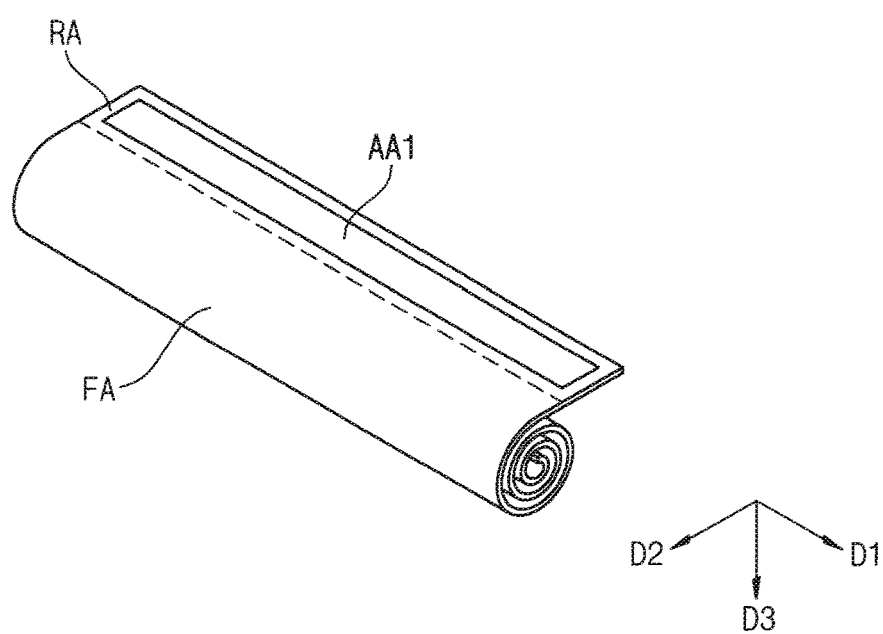
FIG. 21 is a perspective diagram illustrating a rolled state of the display apparatus of FIG. 20 according to example embodiments of the present inventive concept.
Figure 22:
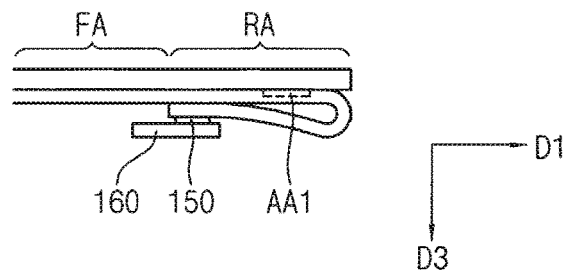
FIG. 22 is a cross-sectional diagram illustrating a non-rolling area of the display apparatus of FIG. 20 according to example embodiments of the present inventive concept.

FIG. 20 is a perspective diagram illustrating a display apparatus according to example embodiments, FIG. 21 is a perspective diagram illustrating a rolled state of the display apparatus of FIG. 20, and FIG. 22 is a cross-sectional diagram illustrating a non-rolling area of the display apparatus of FIG. 20.

Referring to FIGS. 20 to 22, the display apparatus may be a rollable display apparatus, in which the display apparatus is rolled to have a small volume (see FIG. 21) or unrolled to implement a large screen (see FIG. 20).

The display apparatus may include a display area and a non-display area surrounding the display area (not shown), and the display area may include a non-rolling area RA and a rolling area FA.

Here, the non-rolling area RA may include a first antenna area AA1 which is provided with a first antenna element and located on an opposite side of the rolling area FA. The rolling area FA may include a second antenna area AA2 in which a second antenna element is disposed. The second antenna area AA2 may be located on an opposite side of the non-rolling area RA. For example, the second antenna area AA2 may be located at a curved portion disposed at an end of the rolling area FA in a state where the display apparatus is unrolled.

When the display apparatus is in the unrolled state, a portion of the end of the rolling area FA may have a curved surface, and the second antenna area AA2 may be located on the curved surface. (see FIG. 20) When the display apparatus is in a rolled state, the non-rolling area RA may be exposed to an outside without being wound and rolled. Accordingly, the first antenna area AA1 may be exposed to the outside. (see FIG. 21).

Each of the first antenna element and the second antenna element may be electrically connected to a driver 150 disposed in a circuit area through a respective feeder. A connection portion between the circuit area and the non-rolling area RA may be folded, so that the circuit area may be located on a rear side of the non-rolling area RA. The driver 150 may be connected to a driving circuit board 160.

FIGS. 23A to 23F are diagrams illustrating examples in which an electronic apparatus including a display apparatus is implemented as a smart phone according to example embodiments.

Referring to FIGS. 23A to 23F, the electronic apparatus may include a display apparatus 10 including a display surface that displays an image and includes a curved surface, and a housing 20 coupled to the display apparatus 10. The display apparatus 10 of the electronic apparatus may include a curved surface, or may be partially folded or rolled. An antenna element may be disposed on the curved surface of the display apparatus 10. For example, an antenna element may be disposed even on a side surface of the electronic apparatus surrounded by the display area. Accordingly, antenna performance of the electronic apparatus may be improved.

Meanwhile, in these example embodiments, the display apparatus of the electronic apparatus has been implemented in an out-folding type in which a display surface is directed outward in a folded or rolled state, but the present inventive concept is not limited thereto. For example, the display apparatus of the electronic apparatus may be implemented in an in-folding type in which the display surface is directed inward in the folded or rolled state.

Figure 24:
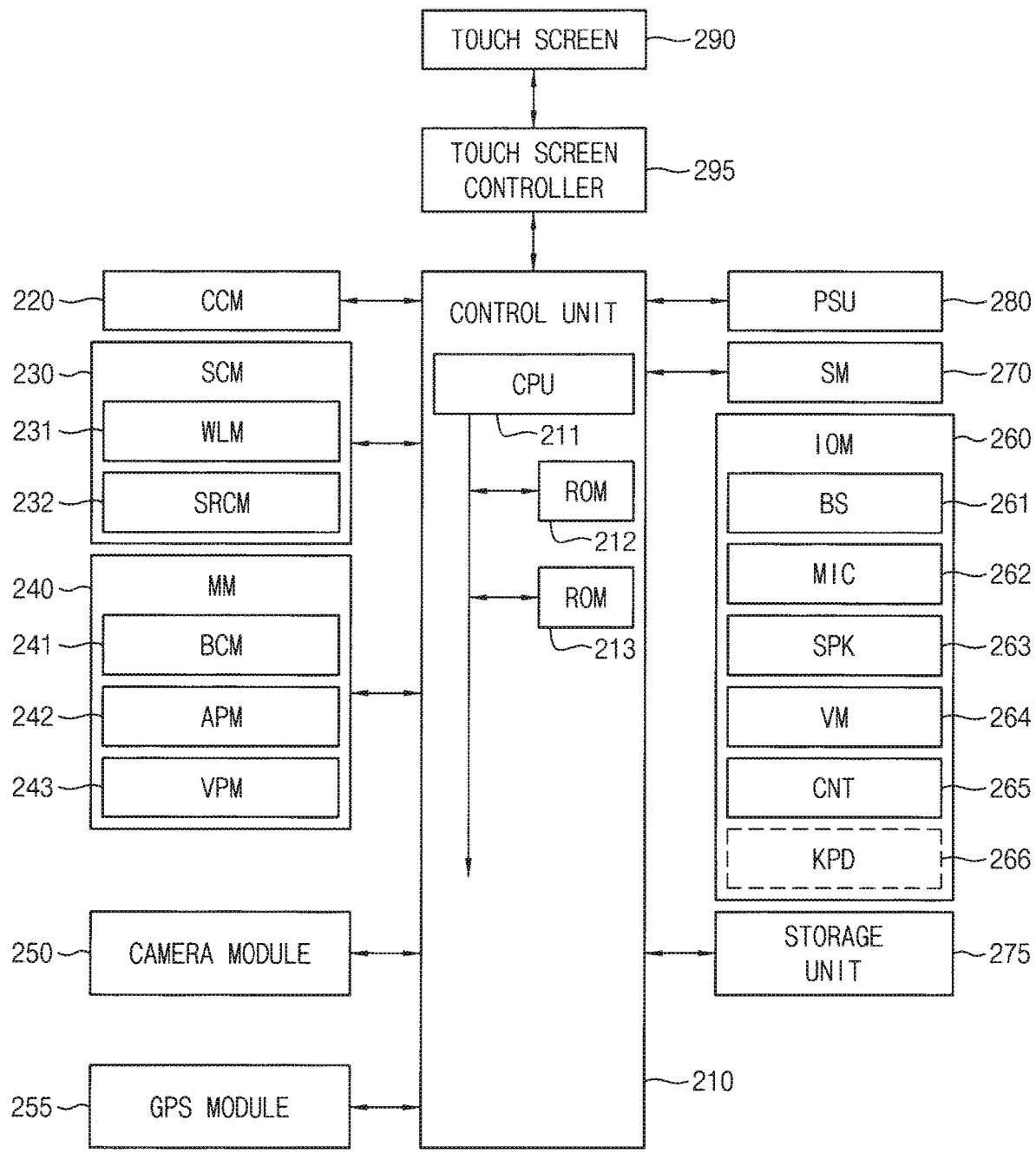
FIG. 24 is a block diagram illustrating a schematic configuration of an electronic apparatus including a display apparatus according to example embodiments of the present inventive concept.

FIG. 24 is a block diagram illustrating a schematic configuration of an electronic apparatus including a display apparatus according to example embodiments.

Referring to FIG. 24, an electronic apparatus 200 may be connected to an external device (not shown) by using at least one of a cellular communication module 220, a sub-communication module 230, and a connector 265. The "external device" may include at least one of another device, a mobile phone, a smart phone, a tablet personal computer (PC), and a computer server.

The electronic apparatus 200 may include a touch screen 290 and a touch screen controller 295. In addition, the electronic apparatus 200 may include a control unit 210, a cellular communication module 220, a sub-communication module 230, a multimedia module 240, a camera module 250, a global positioning system (GPS) module 255, an input/output module 260, a sensor module 270, a storage unit 275, and a power supply unit 280. The sub-communication module 230 may include at least one of a wireless LAN module 231 and a short-range communication module 232, and the multimedia module 240 may include at least one of a broadcast communication module 241, an audio playback module 242, and a video playback module 243. The camera module 250 may include a camera, and the input/output module 260 may include at least one of a button set 261, a microphone 262, a speaker 263, a vibration motor 264, a connector 265, and a keypad 266.

The control unit 210 may include: a CPU 211; a read-only memory (ROM) 212 in which a control program for controlling the electronic apparatus 200 is stored; and a random access memory (RAM) 213 configured to store a signal or data input from an outside of the electronic apparatus 200 or serves as a memory space for a task performed by the electronic apparatus 200. The CPU 211 may include at least one of a single-core processor, a dual-core processor, a triple-core processor, and a quad-core processor. The CPU 211, the ROM 212, and the RAM 213 may be interconnected through an internal bus.

The control unit 210 may control the cellular communication module 220, the sub-communication module 230, the multimedia module 240, the camera module 250, the GPS module 255, the input/output module 260, the sensor module 270, the storage unit 275, the power supply unit 280, the touch screen 290, and the touch screen controller 295.

The cellular communication module 220 allows the electronic apparatus 200 to be connected to the external device (especially a base station of a cellular system) through at least one antenna or a plurality of antennas by using a wireless access technology according to a cellular communication protocol under the control of the control unit 210. For example, the antenna may be disposed on a curved surface of the display apparatus.

The cellular communication module 220 may transmit/receive wireless signals including a voice call, a video call, a short messaging service (SMS) message, or a multimedia messaging service (MMS) message to/from other apparatuses capable of performing communication, such as a mobile phone, a smart phone, a tablet PC, or other devices having a phone number input to the electronic apparatus 200.

The sub-communication module 230 may include at least one of the WLAN module 231 and the short-range communication module 232. For example, the sub-communication module 230 may include only the WLAN module 231, may include only the short-range communication module 232, or may include both the WLAN module 231 and the short-range communication module 232.

The WLAN module 231 may be connected to the Internet at a place where a wireless access point (AP; not shown) is installed under the control of the control unit 210. The WLAN module 231 may support a WLAN standard (IEEE802.11x) of the Institute of Electrical and Electronics Engineers (IEEE).

The short-range communication module 232 may wirelessly perform short-range communication between the electronic apparatus 200 and the external device under the control of the control unit 210. A short-range communication scheme may include Bluetooth, infrared data association (IrDA), and the like.

The electronic apparatus 200 may include at least one of the cellular communication module 220, the WLAN module 231, and the short-range communication module 232 according to performance. For example, the electronic apparatus 200 may include a combination of the cellular communication module 220, the WLAN module 231, and the short-range communication module 232 according to the performance.

The multimedia module 240 may include at least one of the broadcast communication module 241, the audio playback module 242, and the video playback module 243. The broadcast communication module 241 may receive broadcast signals (e.g., TV broadcast signals, radio broadcast signals, or data broadcast signals) and broadcast additional information (e.g., an electric program guide (EPS) or an electric service guide (ESG)) transmitted from a broadcast station through a broadcast communication antenna (not shown) under the control of the control unit 210. The audio playback module 242 may play a digital audio file (e.g., a file with a file extension of mp3, wma, ogg, or wav) stored or received under the control of the control unit 210. The video playback module 243 may play a digital video file (e.g., a file with a file extension of mpeg, mpg, mp4, avi, mov, or mkv) stored or received under the control of the control unit 210. The video playback module 243 may play the digital audio file.

The multimedia module 240 may include the audio playback module 242 and the video playback module 243 except for the broadcast communication module 241. In addition, the audio playback module 242 or the video playback module 243 of the multimedia module 240 may be included in the control unit 210.

The camera module 250 may include a camera for capturing a still image or a video under the control of the control unit 210. The camera may be provided in a housing of the electronic apparatus 200, or may be connected to the electronic apparatus 200 by using a separate connection device. The camera may include an auxiliary light source (e.g., a flash (not shown)) which provides an appropriate amount of light required for a capturing operation.

The camera module 250 may detect a movement or a shape of a user through the camera, and may transmit the detected movement or shape of the user to the control unit 210 as an input for executing or controlling an application. As an example, the movement of the user may refer to a movement of a hand of the user detected through the camera, and the shape of the user may refer to a shape of a face of the user detected through the camera. In another example embodiment, the electronic apparatus 200 may detect the movement of the user by using another device such as an infrared detector, and may execute or control an application in response to the movement.

The GPS module 255 may receive radio waves from a plurality of GPS satellites (not shown) on the earth's orbit, and may calculate a position of the electronic apparatus 200 by using a time of arrival from the GPS satellites (not shown) to the electronic apparatus 200 and GPS parameters.

The input/output module 260 may include at least one of a physical button 261, the microphone 262, the speaker 263, the vibration motor 264, the connector 265, and the keypad 266. The physical button 261 may be configured as a push-type or touch-type button provided on a front surface, a side surface, or rear surface of the housing of the electronic apparatus 200, and may include at least one of a power/lock button, a volume control button, a menu button, a home button, a back button, and a search button. The microphone 262 may receive a voice or a sound to generate an electrical signal under the control of the control unit 210. The speaker 163 may output sounds corresponding to various signals (e.g., a wireless signal, a broadcast signal, a digital audio file, a digital video file, a photographing operation, or the like) of the cellular communication module 220, the sub-communication module 230, the multimedia module 240, or the camera module 250 to the outside of the electronic apparatus 200 under the control of the control unit 210. The speaker 263 may output a sound (e.g., a button operating sound corresponding to a telephone call, or a ring-back tone) corresponding to a function performed by the electronic apparatus 200. One or a plurality of speakers 263 may be provided at an appropriate position or appropriate positions of the housing of the electronic apparatus 200.

As an example, the speaker 263 may include: an internal speaker module disposed at a position suitable for approaching an ear of the user during a call; and an external speaker module having a higher output suitable to be used while playing an audio/video file or watching a broadcast, and disposed at an appropriate position in the housing of the electronic apparatus 200.

The vibration motor 264 may convert an electrical signal into a mechanical vibration under the control of the control unit 210. For example, when the electronic apparatus 200 which is in a vibration mode receives a voice call from another device (not shown), the vibration motor 264 may operate. One or a plurality of vibration motors 264 may be provided in the housing of the electronic apparatus 200. The vibration motor 264 may operate in response to a touch gesture of the user detected on the touch screen 290 and a continuous touch action detected on the touch screen 290.

The connector 265 may be used as an interface for connecting the electronic apparatus 200 to the external device or a power source. The data stored in the storage unit 275 of the electronic apparatus 200 may be transmitted to or received from the external device through a wired cable connected to the connector 265 under the control of the control unit 210. Through the wired cable connected to the connector 265, a power may be input from the power source, or a battery (not shown) may be charged.

The keypad 266 may receive a key input from a user to control the electronic apparatus 200. The keypad 266 may include a physical keypad provided on or connected to the electronic apparatus 200 and/or a virtual keypad displayed on the touch screen 290. The physical keypad provided on the electronic apparatus 200 may be excluded depending on the performance or a structure of the electronic apparatus 200.

The sensor module 270 may include at least one sensor for detecting a state of the electronic apparatus 200. For example, the sensor module 270 may include at least one of a proximity sensor for detecting whether a user approaches the electronic apparatus 200, an illuminance sensor for detecting an amount of light in a periphery of the electronic apparatus 200, and a motion sensor for detecting an operation (e.g., a rotation of the electronic apparatus 200, an absolute/relative movement of at least one panel constituting the electronic apparatus 200, acceleration or vibrations applied to the electronic apparatus 200) of the electronic apparatus 200. Each sensor of the sensor module 270 may detect a state, generate a signal corresponding to the detected state, and transmit the generated signal to the control unit 210. The sensor of the sensor module 270 may be additionally provided or removed according to the performance of the electronic apparatus 200.

The storage unit 275 may store a signal, information, or data which is input/output correspondingly to an operation of the cellular communication module 220, the sub-communication module 230, the multimedia module 240, the camera module 250, the GPS module 255, the input/output module 260, the sensor module 270, and the touch screen 290 under the control of the control unit 210. The storage unit 275 may store control programs and applications for controlling the electronic apparatus 200 or the control unit 210. Hereinafter, the term "storage unit" may include a memory card (e.g., an SD card or a memory stick) which may be detachably attached to the storage unit 275, the ROM 212, the RAM 213, or the electronic apparatus 200. In addition, the storage unit may include a nonvolatile memory, a volatile memory, a hard disk drive (HDD), or a solid state drive (SSD).

The power supply unit 180 may supply a power to one or a plurality of batteries disposed in the housing of the electronic apparatus 200 under the control of the control unit 210. One or a plurality of batteries may supply a power to the control unit 210 and each component module of the electronic apparatus 200. In addition, the power supply unit 280 may supply a power, which is input from an external power source through the wired cable connected to the connector 265, to the electronic apparatus 200.

The touch screen 290 may refer to a display apparatus for displaying various applications (e.g., a call, data transmission, a broadcast, a camera, and the like) which may be executed by the control unit 210, and providing a user interface adapted to the applications. The touch screen 290 may receive at least one touch gesture through a body of the user (e.g., a finger including a thumb) or a detectable input device (e.g., a stylus pen). The user interface may include a predetermined touch area, a soft key, and a soft menu. The touch screen 290 may transmit an electronic signal, which corresponds to the at least one touch gesture input through the user interface, to the touch screen controller 295. In addition, the touch screen 290 may detect a continuous touch action, and may transmit an electronic signal corresponding to a continuous or discontinuous touch action to the touch screen controller 295. The touch screen 290 may be implemented, for example, in a resistive scheme, a capacitive scheme, an infrared scheme, or an acoustic wave scheme.

The touch screen controller 295 may convert the electronic signal received from the touch screen 290 into a digital signal (e.g., X and Y coordinates) to transmit the digital signal to the control unit 210. The control unit 210 may control the touch screen 290 by using the digital signal received from the touch screen controller 295. For example, the control unit 210 may allow the soft key displayed on the touch screen 290 to be selected or execute an application corresponding to the soft key in response to the touch gesture. In addition, the touch screen controller 295 may be included in the control unit 210.

Here, the touch gesture is not limited to direct contact between the touch screen 290 and the body of the user or a touchable input device, and includes non-contact (e.g., a case where a detectable interval between the touch screen 290 and the body of the user or the touchable input device is 1 mm or less). The detectable interval on the touch screen 290 may vary according to the performance or the structure of the electronic apparatus 200.

In this embodiment, the touch gesture may include all kinds of user gestures which make direct contact with the touch screen or approach in proximity to the touch screen so as to be detected by a mobile device. For example, the touch gesture may refer to a user's operation of selecting one position or a plurality of consecutive positions on the touch screen by using a finger of left and right hands (especially an index finger), a thumb, or an object (e.g., a stylus pen) which may be detected by the touch screen. The touch gesture may include operations such as a touch, contact, release of a touch, a tap, contact-and-rotate, a pinch, spread, and touch drag. For example, the touch drag may refer to a gesture of moving the finger or the thumb in a predetermined direction in a state where the finger, the thumb, or the stylus pen contacts the touch screen. For example, the touch drag may include gestures such as touch-and-drag, flick, swipe, slide, and sweep. The state of making contact with the touch screen may include a state where the finger, the thumb, or the stylus pen makes direct contact with the touch screen or approaches in proximity to the touch screen even if the finger, the thumb, or the stylus pen does not actually make contact with the touch screen.

The electronic apparatus 200 may refer to an apparatus for executing an application, a widget, and a function, which are stored in the storage unit and may be executed by the control unit 210, through a touch screen. Typically, the touch screen may provide applications, widgets, functions, and graphical objects (i.e., soft keys or shortcut icons) corresponding to groups thereof through a home screen or an application menu, and the mobile device may execute a corresponding application, widget, or function in response to detection of a touch gesture of the user on each graphic object.

For example, the widget may refer to a mini-application which may be downloaded and used by the user or generated by the user. As an example, the widget may include a weather widget, a stock widget, a calculator widget, an alarm clock widget, a dictionary widget, and the like. The shortcut icon for executing the widget may provide simple dictionary information through a corresponding widget application. As an example, an icon of the weather widget may simply provide a current temperature and a weather symbol, and the widget application executed by touching the icon may provide a greater amount of information such as weather by period/region. Here, the application may include a widget-based application and a non-widget-based application.

In an example embodiment, the touch screen may include one panel (or tablet), and may display one or a plurality of task screens corresponding to one or a plurality of applications under the control of the control unit. In another example embodiment, the touch screen may include two panels which are physically separated and interconnected by a predetermined connection portion, and the panels may be folded in or folded out by a predetermined angle with respect to the connection portion. For example, the connection portion may be a hinge, a flexible connection portion, or a part of a flexible touch screen. In still another example embodiment, the touch screen may be configured as a flexible touch screen which may be bent or folded at least once. The touch screen may display one or a plurality of task screens related to one or a plurality of applications under the control of the control unit.

Figure 25:
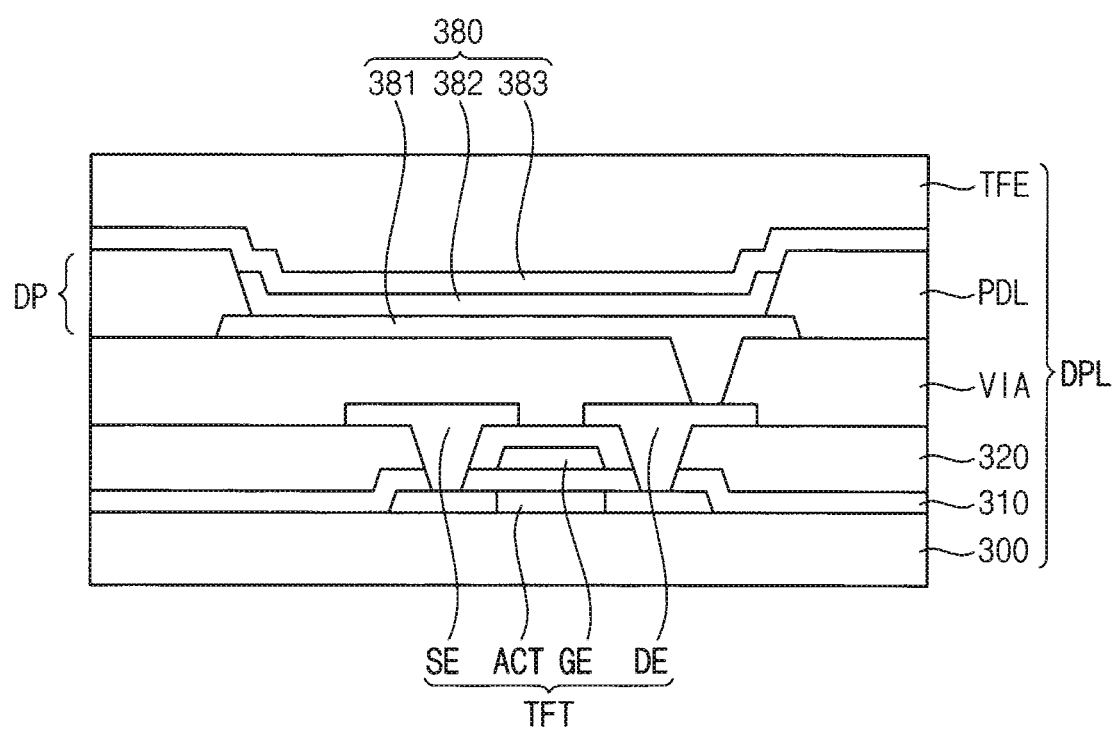
FIG. 25 is a cross-sectional diagram illustrating a display panel of a display panel structure of a display apparatus according to example embodiments of the present inventive concept.

FIG. 25 is a cross-sectional diagram illustrating a display panel of a display panel structure of a display apparatus according to example embodiments.

Referring to FIG. 25, the display panel DPL may include a flexible substrate 300, a thin film transistor TFT, a first insulating layer 310, a second insulating layer 320, a via insulating layer VIA, a pixel defining layer PDL, a light emitting structure 380, a thin film encapsulation layer TFE, and the like. The thin film transistor TFT may include an active pattern ACT, a gate electrode GE, a source electrode SE, and a drain electrode DE. The light emitting structure 380 may include a first electrode 381, a light emitting layer 382, and a second electrode 383.

The flexible substrate 300 may include a transparent or opaque material. The flexible substrate 300 may be a transparent resin substrate. Examples of the transparent resin substrate that may be used as the flexible substrate 300 may include a polyimide substrate. For example, the polyimide substrate may include a first polyimide layer, a barrier film layer, a second polyimide layer, and the like. In some example embodiments, the flexible substrate 300 may include a quartz substrate, a synthetic quartz substrate, a calcium fluoride substrate, a fluorine-doped quartz substrate (F-doped quartz substrate), a soda lime glass substrate, a non-alkali glass substrate, and the like.

A buffer layer (not shown) may be disposed on the flexible substrate 300. The buffer layer may prevent metal atoms or impurities from diffusing from the flexible substrate 300 to the thin film transistor TFT, and may control a heat transfer rate during a crystallization process for forming the active pattern ACT to obtain a substantially uniform active pattern ACT. In addition, when a surface of the flexible substrate 300 is not uniform, the buffer layer may serve to improve flatness of the surface of the flexible substrate 300. Depending on a type of the flexible substrate 300, at least two buffer layers may be provided on the flexible substrate 300, or the buffer layer may not be provided. For example, the buffer layer may include an organic material or an inorganic material.

The active pattern ACT may be disposed on the flexible substrate 300. The active pattern ACT may include a metal oxide semiconductor, an inorganic semiconductor (e.g., amorphous silicon or poly silicon semiconductor), an organic semiconductor, or the like. The active pattern ACT may have a source region, a drain region, and a channel region disposed between the source region and the drain region.

The first insulating layer 310 may be disposed on the active pattern ACT. For example, the first insulating layer 310 may sufficiently cover the active pattern ACT on the flexible substrate 300, and may have a substantially flat top surface without creating a step around the active pattern ACT. In some example embodiments, the first insulating layer 310 may be disposed along a profile of the active pattern ACT with a uniform thickness to cover the active pattern ACT on the flexible substrate 300. The first insulating layer 310 may include a silicon compound, metal oxide, and the like. For example, the first insulating layer 310 may include silicon oxide ($SiO_x$), silicon nitride ($SiN_x$), silicon oxynitride ($SiO_xN_y$), silicon oxycarbide ($SiO_xC_y$), silicon carbonitride ($SiC_xN_y$), aluminum oxide ($AlO_x$), aluminum nitride ($AlN_x$), tantalum oxide ($TaO_x$), hafnium oxide ($HfO_x$), zirconium oxide ($ZrO_x$), titanium oxide ($TiO_x$), and the like. In some example embodiments, the first insulating layer 310 may have a multilayer structure including a plurality of insulating layers. For example, the insulating layers may have different thicknesses or may include different materials.

A gate pattern including the gate electrode GE may be disposed on the first insulating layer 310. The gate pattern may overlap the channel region of the active pattern ACT. The gate electrode GE may include a metal, an alloy, metal nitride, conductive metal oxide, a transparent conductive material, and the like. For example, the gate electrode 170 may include gold (Au), silver (Ag), aluminum (Al), tungsten (W), copper (Cu), platinum (Pt), nickel (Ni), titanium (Ti), palladium (Pd), magnesium (Mg), calcium (Ca), lithium (Li), chromium (Cr), tantalum (Ta), molybdenum (Mo), scandium (Sc), neodymium (Nd), iridium (Ir), an aluminum-containing alloy, aluminum nitride ($AlN_x$), a silver-containing alloy, tungsten nitride ($WN_x$), a copper-containing alloy, a molybdenum-containing alloy, titanium nitride ($TiN_x$), chromium nitride ($CrN_x$), tantalum nitride ($TaN_x$), strontium ruthenium oxide ($SrRu_xO_y$), zinc oxide ($ZnO_x$), indium tin oxide (ITO), tin oxide ($SnO_x$), indium oxide ($InO_x$), gallium oxide ($GaO_x$), indium zinc oxide (IZO), and the like. These may be used alone or in combination with each other. In some example embodiments, the gate pattern may include a multilayer structure including a plurality of metal layers. For example, the metal layers may have different thicknesses or may include different materials.

The second insulating layer 320 may be disposed on the gate pattern. For example, the second insulating layer 320 may sufficiently cover the gate pattern on the first insulating layer 310, and may have a substantially flat top surface without creating a step around the gate pattern. In some example embodiments, the second insulating layer 320 may be disposed along a profile of the gate pattern with a uniform thickness to cover the gate pattern on the first insulating layer 310. The second insulating layer 320 may include a silicon compound, metal oxide, and the like. In some example embodiments, the second insulating layer 320 may have a multilayer structure including a plurality of insulating layers. For example, the insulating layers may have different thicknesses or may include different materials.

A data pattern including the source electrode SE and the drain electrode DE of the thin film transistor TFT may be disposed on the second insulating layer 320. The source electrode SE may be connected to the source region of the active pattern ACT through a contact hole formed by removing first portions of the first insulating layer 310 and the second insulating layer 320, and the drain electrode DE may be connected to the drain region of the active pattern ACT through a contact hole formed by removing second portions of the first insulating layer 310 and the second insulating layer 320. Each of the data patterns may include a metal, an alloy, metal nitride, conductive metal oxide, a transparent conductive material, and the like. These may be used alone or in combination with each other. In some example embodiments, the data pattern may have a multilayer structure including a plurality of metal layers. For example, the metal layers may have different thicknesses or may include different materials.

Accordingly, thin film transistor TFT including the active pattern ACT, the first insulating layer 310, the gate electrode 170, the second insulating layer 320, the source electrode SE, and the drain electrode may be provided.

Although the thin film transistor TFT has been described as having a top gate structure, the configuration of the present inventive concept is not limited thereto. For example, the thin film transistor TFT may have a bottom gate structure, a double gate structure, or the like.

The via insulating layer VIA may be disposed on the second insulating layer 320 and the data pattern. For example, the via insulating layer VIA may have a relatively thick thickness. For example, the via insulating layer VIA may have a substantially flat top surface. In order to implement such a flat top surface of the via insulating layer VIA, a planarization process may be additionally performed on the via insulating layer VIA. In some example embodiments, the via insulating layer VIA may be disposed along a profile of the data pattern with a uniform thickness on the second insulating layer 320. The via insulating layer VIA may be formed of an organic material or an inorganic material. In example embodiments, the via insulating layer VIA may include an organic material. For example, the via insulating layer VIA may include a photoresist, a polyacryl-based resin, a polyimide-based resin, a polyamide-based resin, a siloxane-based resin, an acryl-based resin, an epoxy-based resin, and the like.

The first electrode 381 may be disposed on the via insulating layer VIA. The first electrode 381 may be electrically connected to the thin film transistor TFT through a contact hole formed by removing a portion of the via insulating layer VIA. The first electrode 381 may include a metal, an alloy, metal nitride, conductive metal oxide, a transparent conductive material, and the like. These may be used alone or in combination with each other. In some example embodiments, the first electrode 381 may have a multilayer structure including a plurality of metal layers. For example, the metal layers may have different thicknesses or may include different materials.

The pixel defining layer PDL may be disposed on the via insulating layer VIA. For example, the pixel defining layer PDL may expose a portion of a top surface of the first electrode 381 while covering both sides of the first electrode 381. The pixel defining layer PDL may be formed of an organic material or an inorganic material. In example embodiments, the pixel defining layer 310 may include an organic material.

The light emitting layer 383 may be disposed on the pixel defining layer PDL and the first electrode 381. The light emitting layer 383 may be formed by using at least one of light emitting materials for emitting different color lights (i.e., red light, green light, blue light, etc.) according to sub-pixels. Alternatively, the light emitting layer 383 may be formed by stacking a plurality of light emitting materials for generating different color lights such as red light, green light, and blue light to emit white light as a whole. For example, a color filter may be disposed on the light emitting layer 383 which is disposed on the first electrode 381. The color filter may include at least one of a red color filter, a green color filter, and a blue color filter. In some example embodiments, the color filter may include a yellow color filter, a cyan color filter, and a magenta color filter. The color filter may include a photosensitive resin or a color photoresist.

The second electrode 383 may be disposed on the light emitting layer 382 and the pixel defining layer PDL. The second electrode 383 may include a metal, an alloy, metal nitride, conductive metal oxide, a transparent conductive material, and the like. These may be used alone or in combination with each other. In some example embodiments, the second electrode 383 may have a multilayer structure including a plurality of metal layers. For example, the metal layers may have different thicknesses or may include different materials.

The thin film encapsulation layer TFE may be disposed on the second electrode 383. The thin film encapsulation layer TFE may include at least one inorganic layer and at least one organic layer which are alternately stacked on each other. For example, the thin film encapsulation layer TFE may include a first inorganic layer, an organic layer disposed on the first inorganic layer, and a second inorganic layer disposed on the organic layer. The thin film encapsulation layer TFE may prevent the light emitting layer 382 from being degraded due to penetration of moisture, oxygen, and the like. In addition, the thin film encapsulation layer TFE may also function to protect the display panel DPL from an external impact. Further, the thin film encapsulation layer TFE may improve flatness of the display panel DPL.

The present inventive concept may be applied to a display apparatus and an electronic apparatus including the display apparatus. For example, the present inventive concept may be applied to a smart phone, a cellular phone, a video phone, a smart pad, a smart watch, a tablet PC, a car navigation system, a television, a computer monitor, a laptop, a head mounted display (HMD) apparatus, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A display apparatus comprising:
   a flexible display panel including a display area that includes a first folding area and a main display area, the display area including an upper surface and a lower surface and displaying an image via the upper surface of the display area;
   a cover window disposed on the upper surface of the display area; and
   an antenna layer including a first antenna disposed on an upper surface of the first folding area,
   wherein the first folding area is connected to a first edge of the main display area, wherein the first folding area, when bent with respect to the main display area, is configured to have the upper surface of the first folding area with a curved surface,
   wherein the first antenna is disposed on the curved surface of the upper surface of the first folding area,
   wherein the flexible display panel further includes;
   a first circuit area on which a driver is attached; and
   a first connection portion connecting the first circuit area to the first folding area, and
   wherein, when the first connection portion is folded or bent, a lower surface of the first circuit area contacts a lower surface of the main display area and the first antenna is disposed in a space between the cover window and the first circuit area.

2. The display apparatus of claim 1,
   wherein the display area further includes a second folding area that is connected to a second edge of the main display area,
   wherein the antenna layer further includes a second antenna disposed on an upper surface of the second folding area,
   wherein the second folding area, when bent with respect to the main display area, is configured to have the upper surface of the second folding area with a curved surface, and
   wherein the second antenna is disposed on the curved surface of the upper surface of the second folding area.

3. The display apparatus of claim 2,
   wherein the display area further includes a third folding area that is connected to a third edge of the main display area,
   wherein the antenna layer further includes a third antenna disposed on an upper surface of the third folding area,
   wherein the third folding area, when bent with respect to the main display area, is configured to have the upper surface of the third folding area with a curved surface, and
   wherein the third antenna is disposed on the curved surface of the upper surface of the third folding area.

4. The display apparatus of claim 3,
   wherein the display area further includes a fourth folding area that is connected to a fourth edge of the main display area,
   wherein the antenna layer further includes a fourth antenna disposed on an upper surface of the fourth folding area,
   wherein the fourth folding area, when bent with respect to the main display area, is configured to have the upper surface of the fourth folding area with a curved surface, and
   wherein the fourth antenna is disposed on the curved surface of the upper surface of the fourth folding area.

5. The display apparatus of claim 1,
   wherein the first connection portion, when folded or bent, between the first circuit area and the display area is configured to cause the first circuit area to face toward the lower surface of the display area, and
   wherein the first circuit area and the first connection portion are a non-pixel area of the flexible display panel.

6. The display apparatus of claim 1,
   wherein the first antenna includes a radiation pattern having a lattice shape or a mesh shape.

7. The display apparatus of claim 1,
   wherein the flexible display panel includes a flexible substrate, a thin film transistor disposed on the flexible substrate, a light emitting structure electrically connected to the thin film transistor, and a thin film encapsulation layer disposed on the light emitting structure, and
   wherein the antenna layer is disposed on the thin film encapsulation layer.

8. The display apparatus of claim 1, further comprising:
   a touch electrode layer disposed between the cover window and the flexible display panel and including a touch electrode.

9. The display apparatus of claim 1,
   wherein the first antenna is embedded in the flexible display panel.

10. The display apparatus of claim 1,
    wherein the first antenna includes a conductive layer disposed between insulating layers.

11. A display apparatus comprising:
    a flexible display panel including a display area that includes a first non-folding area, a second non-folding area spaced apart from the first non-folding area, and a first folding area disposed between the first non-folding area and the second non-folding area, the display area including an upper surface and a lower surface and displaying an image via the upper surface of the display area;
    a cover window disposed on the upper surface of the display area; and
    an antenna layer including a first antenna disposed on an upper surface of the first folding area, the upper surface of the first folding area being located on an outer side in a folded state of the flexible display panel,
    wherein the first folding area, when folded with respect to the first non-folding area and the second non-folding area, is configured to have the upper surface of the first folding area with a curved surface, and
    wherein the first antenna is disposed on the curved surface of the upper surface of the first folding area, wherein the flexible display panel further includes:
- a first circuit area on which a driver is attached; and
- a first connection portion connecting the first circuit area to the first folding area, and wherein, when the first connection portion is folded or bent, a lower surface of the first circuit area contacts a lower surface of the display area and the first antenna is disposed in a space between the cover window and the first circuit area.

12. The display apparatus of claim 11,
wherein the display area further includes a third non-folding area spaced apart from the second non-folding area and a second folding area disposed between the second non-folding area and the third non-folding area.

13. The display apparatus of claim 12,
wherein an upper surface of the first non-folding area is located on an outer side in the folded state of the flexible display panel, and an upper surface of the second non-folding area, an upper surface of the second folding area, and an upper surface of the third non-folding area are located on an inner side in the folded state of the flexible display panel.

14. The display apparatus of claim 12,
wherein the antenna layer further includes a second antenna disposed on an upper surface of the second folding area, the upper surface of the second folding area being located on an outer side in the folded state of the flexible display panel,
wherein the second folding area, when folded with respect to the second non-folding area and the third non-folding area, is configured to have the upper surface of the second folding area with a curved surface, and
wherein the second antenna is disposed on the curved surface of the upper surface of the second folding area.

15. The display apparatus of claim 14,
wherein, in the folded state of the flexible display panel, the first non-folding area, the second non-folding area, and the third non-folding area overlap each other, and
wherein an upper surface of the first non-folding area and an upper surface of the second non-folding area are located on an outer side in the folded state of the flexible display panel, and an upper surface of the third non-folding area is located on an inner side in the folded state of the flexible display panel.

16. The display apparatus of claim 15,
wherein the antenna layer further includes a third antenna disposed on an edge portion of the upper surface of the first non-folding area.

17. The display apparatus of claim 14,
wherein, in the folded state of the flexible display panel, the first non-folding area overlaps the second non-folding area, the third non-folding area overlaps the second non-folding area, and the first non-folding area and the third non-folding area do not overlap each other, and
wherein an upper surface of the first non-folding area, an upper surface of the second non-folding area, and an upper surface of the third non-folding area are located on an outer side in the folded state of the flexible display panel.

18. The display apparatus of claim 17,
wherein the antenna layer further includes a third antenna disposed on an edge portion of the upper surface of the first non-folding area.

19. The display apparatus of claim 17,
wherein the antenna layer further includes a fourth antenna disposed on an edge portion of the upper surface of the third non-folding area.

20. A display apparatus comprising:
- a flexible display panel including a display area that includes a non-rolling area and a rolling area, the rolling area winding at least two times and the display area including an upper surface and a lower surface and displaying an image via the upper surface of the display area;
- a cover window disposed on the upper surface of the display area; and
- an antenna layer including a first antenna disposed on an upper surface of the non-rolling area and a second antenna disposed on an edge portion of an upper surface of the rolling area, the first antenna and the second antenna being disposed at opposite end portions of the display area, wherein the edge portion of the rolling area, when the rolling area is rolled, is configured to have a curved surface, and
wherein the second antenna is disposed on the curved surface of the edge portion of the rolling area.

* * * * *